(12) United States Patent
Schulte et al.

(10) Patent No.: US 9,825,228 B2
(45) Date of Patent: Nov. 21, 2017

(54) HYPERBRANCHED POLYMERS, PROCESS FOR THE PREPARATION THEREOF AND USE THEREOF IN ELECTRONIC DEVICES

(71) Applicant: Merck Patent GmbH, Darmstadt (DE)

(72) Inventors: Niels Schulte, Kelkheim (DE); Eva Maria Reis, Breuberg (DE)

(73) Assignee: MERCK PATENT GMBH, Darmstadt (DE)

( * ) Notice: Subject to any disclaimer, the term of this patent is extended or adjusted under 35 U.S.C. 154(b) by 742 days.

(21) Appl. No.: 14/354,388

(22) PCT Filed: Oct. 1, 2012

(86) PCT No.: PCT/EP2012/004112
§ 371 (c)(1),
(2) Date: Apr. 25, 2014

(87) PCT Pub. No.: WO2013/060411
PCT Pub. Date: May 2, 2016

(65) Prior Publication Data
US 2014/0339476 A1    Nov. 20, 2014

(30) Foreign Application Priority Data
Oct. 28, 2011    (DE) .................. 10 2011 117 422

(51) Int. Cl.
| | | |
|---|---|---|
| *H01L 51/54* | (2006.01) | |
| *C09K 11/06* | (2006.01) | |
| *H01L 51/00* | (2006.01) | |
| *C08G 61/12* | (2006.01) | |
| *C08G 83/00* | (2006.01) | |
| *H05B 33/14* | (2006.01) | |

(52) U.S. Cl.
CPC .......... *H01L 51/0035* (2013.01); *C08G 61/12* (2013.01); *C08G 83/005* (2013.01); *C09K 11/06* (2013.01); *H01L 51/0043* (2013.01); *H01L 51/0095* (2013.01); *H05B 33/14* (2013.01); *C08G 2261/132* (2013.01); *C08G 2261/3162* (2013.01); *C08G 2261/411* (2013.01); *C08G 2261/512* (2013.01); *C08G 2261/91* (2013.01); *C08G 2261/92* (2013.01); *C08G 2261/95* (2013.01); *C09K 2211/1007* (2013.01); *C09K 2211/1011* (2013.01); *C09K 2211/1014* (2013.01); *C09K 2211/1029* (2013.01); *H01L 51/0037* (2013.01); *H01L 51/0056* (2013.01); *H01L 51/0058* (2013.01); *H01L 51/0067* (2013.01); *H01L 51/0077* (2013.01); *H01L 2251/308* (2013.01); *Y02E 10/549* (2013.01)

(58) Field of Classification Search
CPC ............ C09K 11/06; C09K 2211/1007; C09K 2211/1011; C09K 2211/1014; C09K 2211/1029; Y02E 10/549; H05B 33/14; C08G 61/00; C08G 61/02; C08G 61/12; C08G 61/122; C08G 61/123; C08G 61/124; C08G 61/125; C08G 61/126; C08G 83/00; C08G 83/001; C08G 83/002; C08G 83/003; C08G 83/005; C08G 2261/13; C08G 2261/131; C08G 2261/132; C08G 2261/316; C08G 2261/3162; C08G 2261/411; C08G 2261/51; C08G 2261/514; C08G 2261/512; C08G 2261/52; C08G 2261/522; C08G 2261/524; C08G 2261/91; C08G 2261/92; C08G 2261/95; H01L 51/0032; H01L 51/0034; H01L 51/0035; H01L 51/0037; H01L 51/0038; H01L 51/0043; H01L 51/005; H01L 51/0056; H01L 51/0058; H01L 51/0067; H01L 51/0071; H01L 51/0072; H01L 51/0077; H01L 51/0095; H01L 51/5012; H01L 51/5016
USPC ....... 428/690, 691, 917, 411.4, 336; 427/58, 427/66; 313/500–512; 257/40, 88–104, 257/E51.001–E51.052; 252/301.16–301.35, 500; 528/7, 8
See application file for complete search history.

(56) References Cited

U.S. PATENT DOCUMENTS

| | | | |
|---|---|---|---|
| 6,025,462 A | 2/2000 | Wang et al. | |
| 2004/0137263 A1* | 7/2004 | Burn ................... | C07F 15/0033 428/690 |
| 2006/0009614 A1* | 1/2006 | Yamahara ............ | C08G 83/003 528/380 |
| 2006/0102890 A1 | 5/2006 | Yamahara | |
| 2008/0280163 A1* | 11/2008 | Kwong ............... | C07F 15/0033 428/704 |

FOREIGN PATENT DOCUMENTS

| | | |
|---|---|---|
| EP | 1535942 A1 | 6/2005 |
| JP | 09-59355 | 3/1997 |
| JP | 09-302073 | 11/1997 |
| JP | 10-306143 | 11/1998 |
| JP | 200499674 | 4/2004 |

OTHER PUBLICATIONS

Kim et al., "Hyperbranched Polyphenylenes", Macromolecules, 1992, vol. 25, No. 21, pp. 5561-5572.

* cited by examiner

*Primary Examiner* — Andrew K Bohaty
(74) *Attorney, Agent, or Firm* — RatnerPrestia

(57) ABSTRACT

The present invention relates to hyperbranched polymers, to a process for the preparation thereof, and to the starting compounds necessary for the preparation. The present invention furthermore relates to the use of the hyperbranched polymers according to the invention in electronic devices and to the electronic devices themselves.

17 Claims, 1 Drawing Sheet

OLED layer structure
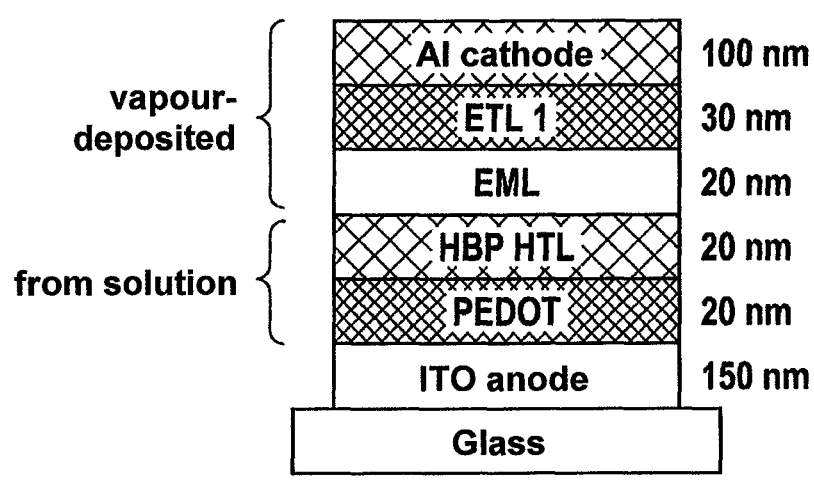

HYPERBRANCHED POLYMERS, PROCESS FOR THE PREPARATION THEREOF AND USE THEREOF IN ELECTRONIC DEVICES

RELATED APPLICATIONS

This application is a national stage application filed pursuant to 35 U.S.C. §371 of PCT/EP2012/004112, filed Oct. 1, 2012, which claims the benefit of German Patent Application No. 10 2011 117 422.6, filed Oct. 28, 2011, which is incorporated herein by reference in its entirety.

The present invention relates to hyperbranched polymers, to a process for the preparation thereof, and to the starting compounds necessary for the preparation. The present invention furthermore relates to the use of the hyperbranched polymers according to the invention in electronic devices and to the electronic devices themselves.

Electronic devices which comprise organic, organometallic and/or polymeric semiconductors are increasing in importance; they are employed in many commercial products for cost reasons and owing to their performance. Examples which may be mentioned here are organic-based charge-transport materials (for example triarylamine-based hole transporters) in photocopiers, organic or polymeric light-emitting diodes (OLEDs or PLEDs) and in display devices, or organic photoreceptors in photocopiers. Organic solar cells (O-SC), organic field-effect transistors (O-FET), organic thin-film transistors (O-TFT), organic integrated circuits (O-IC), organic optical amplifiers and organic laser diodes (O-lasers) are at an advanced stage of development and may achieve major importance in the future.

Irrespective of the particular application, many of these electronic devices have the following general layer structure, which can be adapted for the particular application:
(1) substrate,
(2) electrode, frequently metallic or inorganic, but also made from organic or polymeric, conductive materials,
(3) charge-injection layer(s) or interlayer(s), for example for compensation of electrode unevenness ("planarisation layer"), frequently made from a conductive, doped polymer,
(4) organic semiconductors,
(5) optionally further charge-transport, charge-injection or charge-blocking layers,
(6) counterelectrode, materials as mentioned under (2),
(7) encapsulation.

The above arrangement represents the general structure of an organic, electronic device, where various layers can be combined, resulting in the simplest case in an arrangement comprising two electrodes, between which an organic layer is located. In this case, the organic layer fulfils all functions, including the emission of light in the case of OLEDs. A system of this type is described, for example, in WO 90/13148 A1 based on poly(p-phenylenes).

However, a problem which arises in a "three-layer system" of this type is the lack of control of charge separation or the lack of a way of optimising the properties of the individual constituents in different layers, as is solved in a simple manner by a multilayered structure, for example, in the case of SMOLEDs ("small-molecule OLEDs").

A small-molecule OLED often comprises one or more organic hole-injection layers, hole-transport layers, emission layers, electron-transport layers and/or electron-injection layers and an anode and a cathode, where the entire system is usually located on a glass substrate. The advantage of a multilayered structure of this type consists in that the various functions of charge injection, charge transport and emission can be distributed over the various layers and the properties of the respective layers can thus be modified separately. This modification enables the performance of the electronic devices to be considerably improved.

A disadvantage of electronic devices which are based on the small molecules described above, i.e. non-polymeric compounds, is the production thereof. Non-polymeric compounds are usually converted into electronic devices by evaporation techniques. This represents a major cost disadvantage, in particular for large-area devices, since a multi-step vacuum process in various chambers is very expensive and must be controlled very precisely. Less expensive and established coating methods from solution, such as, for example, ink-jet printing, airbrush methods, roll-to-roll processes, etc., would be a major advantage here. However, the above-described devices comprising small molecules generally cannot be produced in this way owing to the low solubility of the non-polymeric compounds in the usual solvents. Although the solubility of these compounds can be improved by modification, the electronic devices obtained exhibit, however, reduced performance and lifetime compared with the devices obtained by gas-phase deposition.

The object of the present invention can thus be regarded as being the provision of materials for electronic devices, in particular OLEDs, which on the one hand have the good performance of so-called "small molecules" but on the other hand also have the good processability of polymers.

Surprisingly, it has been found that these objects and further objects which are not mentioned explicitly, but can readily be derived or deduced from the contexts discussed in the introduction herein, are achieved by hyperbranched polymers having the features of patent Claim 1. Preferred embodiments of the hyperbranched polymers according to the invention are placed under protection in the dependent claims which are dependent on Claim 1.

BRIEF DESCRIPTION OF DRAWINGS

FIG. 1 depicts an OLED layer structure.

The present invention accordingly relates to a hyperbranched polymer containing at least one unit of the general formula (I)

where
$A_1$ is a functional structural element,
m is an integer $\geq 3$, preferably $\geq 10$ and particularly preferably $\geq 20$, and
the lines represent connections to further units of the polymer, and
at least one unit of the general formula (II)

where
$A_2$ is a functional structural element, preferably a functional structural element which is different from $A_1$,
l is an integer $\geq 1$, preferably $\geq 10$ and particularly preferably $\geq 20$, and the line represents the connection to another unit of the polymer, characterised in that at least one unit of the general formula (I) or at least one unit of the general formula (II) is selected from a solubility-promoting unit of the general formula (III):

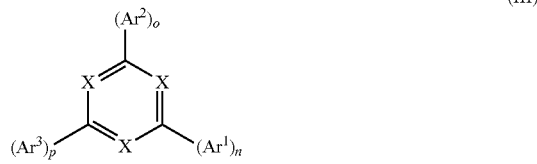

where
Ar$^1$, Ar$^2$, Ar$^3$ is each, independently of one another, an aryl or heteroaryl group, which may be substituted by one or more of any desired radicals R$^1$,
X is in each case, independently of one another, N or CR$^2$, preferably CH,
R$^1$, R$^2$ is each, Independently of one another, hydrogen, a straight-chain alkyl, alkoxy or thioalkoxy group having 1 to 40 C atoms or a branched or cyclic alkyl, alkoxy or thioalkoxy group having 3 to 40 C atoms or a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, a hydroxyl group, a nitro group, a CF$_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups R$^1$ and/or R$^2$ may form a mono- or polycyclic, aliphatic or aromatic ring system with one another and/or with the ring to which the group R$^1$ is bonded; and
n, o, p may each, independently of one another, identically or differently, be 0 or 1,
where the solubility-promoting unit of the general formula (III) has three bonds to other units of the polymer if it represents a unit of the general formula (I), and the solubility-promoting unit of the general formula (III) has one bond to another unit of the polymer if it represents a unit of the general formula (II).

In the present application, the term polymer is taken to mean both polymeric compounds, oligomeric compounds, and dendrimers. The polymeric compounds according to the invention preferably have 10 to 10000, particularly preferably 15 to 1000 and in particular 20 to 500 structural units. The oligomeric compounds according to the invention preferably have 3 to 9 structural units.

The branching factor of the polymers here is between 0 (linear polymer, no branching points) and 1 (fully branched dendrimer), preferably between 0.1 and 0.9 and particularly preferably between 0.25 and 0.75.

Apart from the condition that at least one unit of the general formula (I) or at least one unit of the general formula (II) must represent a solubility-promoting unit of the general formula (III), neither the functional structural element A$_1$ of the unit of the general formula (I) nor the functional structural element A$_2$ of the general formula (II) is subject to any particular limitation at all. It is thus possible for all known materials which can be employed in electronic devices in order to achieve functional properties to be employed as units of the general formula (I) or as units of the general formula (II) in the hyperbranched polymers according to the invention.

These are, Inter alia, those as disclosed and extensively listed in WO 02/077060 A1 and in WO 2005/014689 A2. These are considered to be part of the present invention by way of reference. The functional structural elements A$_1$ and A$_2$ can originate, for example, from the following classes:
Group 1: units which have hole-injection and/or hole-transport properties;
Group 2: units which have electron-injection and/or electron-transport properties;
Group 3: units which have light-emitting properties;
Group 4: units which can serve as host materials or co-host materials;
Group 5: units which improve the transfer from the so-called singlet state to the triplet state.

Structural elements from group 1 which have hole-injection and/or hole-transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital).

As structural elements from group 1 which have hole-injection and/or hole-transport properties, particular mention may be made of phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717,462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conducting macromolecules, porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. Nos. 3,567,450 and 3,658,520), or tetraaryldiamines (the two tertiary amine units are connected via an aryl group). More triarylamino groups may also be present in the molecule. Phthalocyanine derivatives, naphthalocyanine derivatives, butadiene derivatives and quinoline derivatives, such as, for example, dipyrazino[2,3-f:2',3'-h]quinoxalinehexacarbonitrile, are also suitable.

Preference is given to aromatic tertiary amines containing at least two tertiary amine units (US 2008/0102311 A1, U.S. Pat. Nos. 4,720,432 and 5,061,569), such as, for example, NPD (α-NPD=4,4'-bis[N-(1-naphthyl)-N-phenylamino]biphenyl) (U.S. Pat. No. 5,061,569), TPD 232 (=N,N'-bis-(N,N'-diphenyl-4-aminophenyl)-N,N-diphenyl-4,4'-diamino-1,1'-biphenyl) or MTDATA (MTDATA or m-MTDATA=4,4',4''-tris[3-methylphenyl)phenylamino]-triphenylamine) (JP-A-4-308688), TBDB (=N,N,N',N'-tetra(4-biphenyl)diaminobiphenylene), TAPC (=1,1-bis(4-di-μ-tolylaminophenyl)cyclohexane), TAPPP (=1,1-bis(4-di-μ-tolylaminophenyl)-3-phenylpropane), BDTAPVB (=1,4-bis[2-[4-[N,N-di(p-tolyl)amino]phenyl]vinyl]benzene), TTB S(=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'''-diamino-1,1',4',1'',4'',1'''-quaterphenyl, likewise tertiary amines containing carbazole units, such as, for example, TCTA (=4-(9H-carbazol-9-yl)-N,N-bis[4-(9H-carbazol-9-yl)phenyl]benzenamine). Preference is likewise given to hexaazatriphenylene compounds in accordance with US 2007/0092755 A1 and phthalocyanine derivatives (for example H₂Pc, CuPc (=copper phthalocyanine), CoPc, NiPc, ZnPc, PdPc, FePc, MnPc, ClAlPc, ClGaPc, ClInPc, ClSnPc, Cl₂SiPc, (HO)AlPc, (HO)GaPc, VOPc, TiOPc, MoOPc, GaPc-O—GaPc).

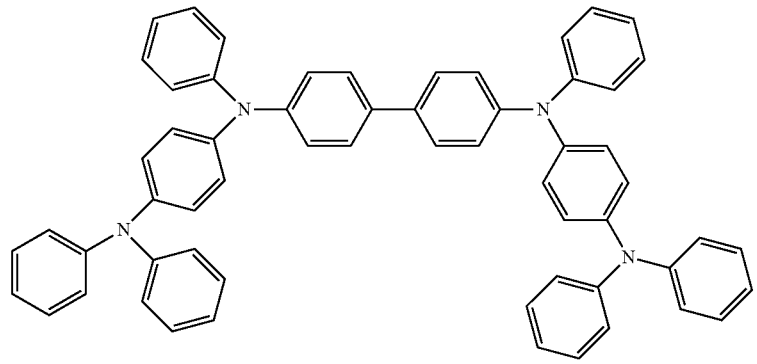

TPD 232

Particular preference is given to the following triarylamine compounds, which may also be substituted:

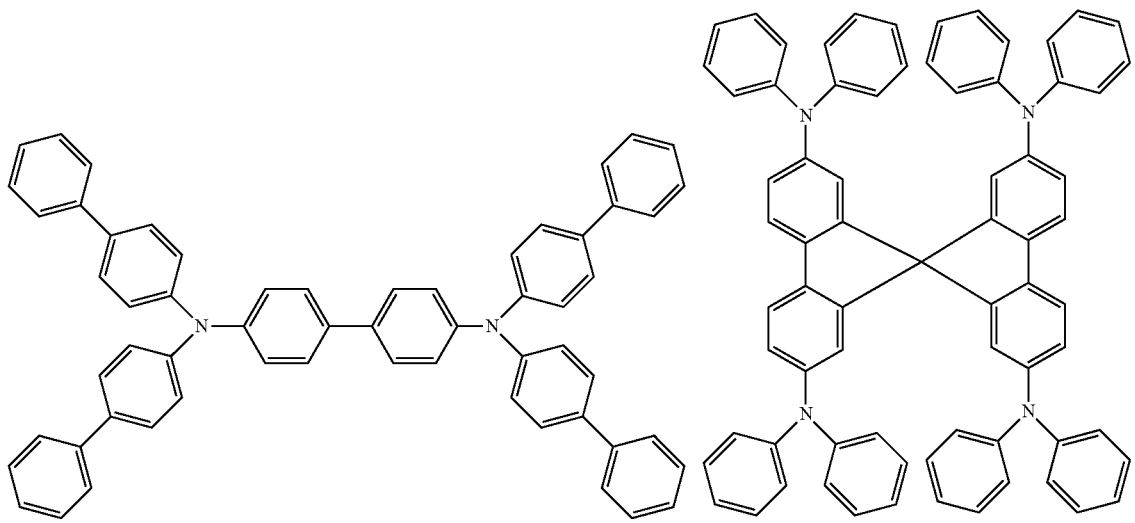

TBDB: EP 1162193 B1 and EP 650955 B1

Synth.Metals 1997, 91(1-3), 209 and DE 19646119 A1

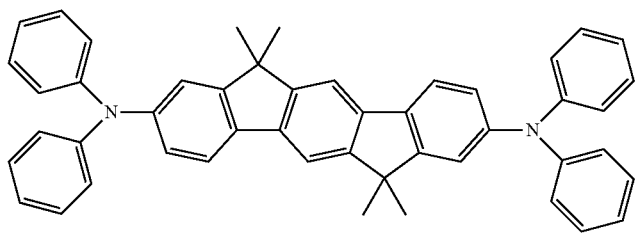

WO 2006 122630 A1 and EP 1860097 A1

-continued
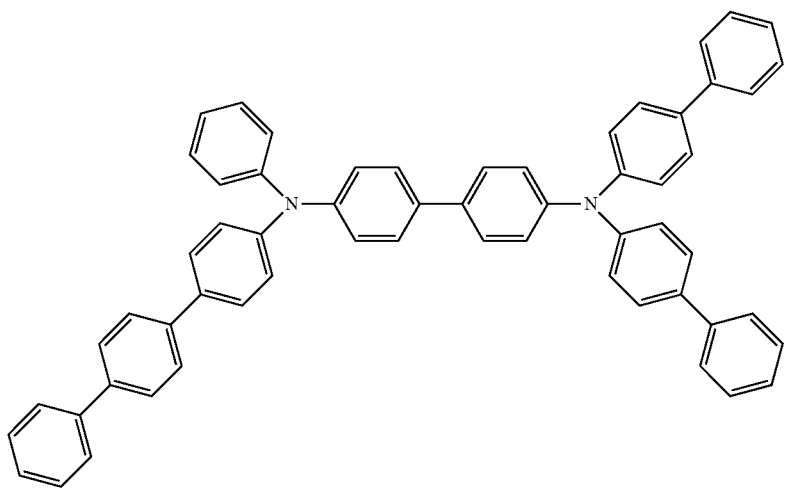
EP 1834945 A1
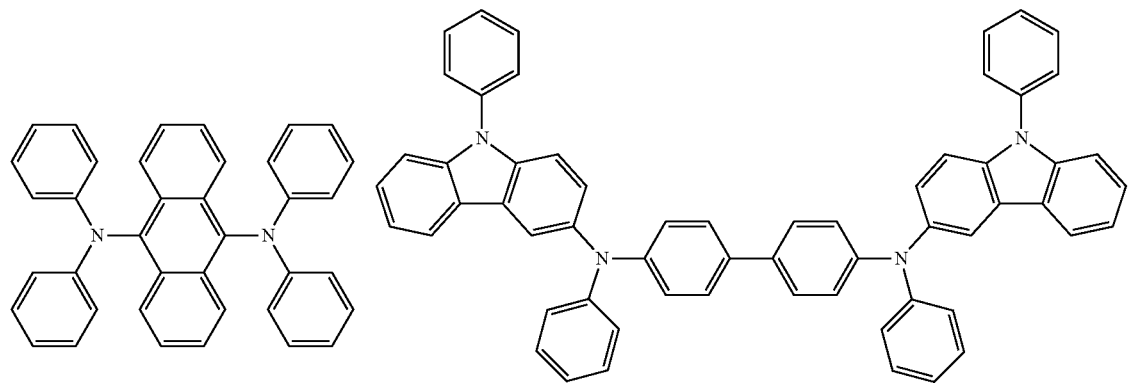
JP 08053397 A and U.S. Pat No. 6,251,531 B1
EP 1661888
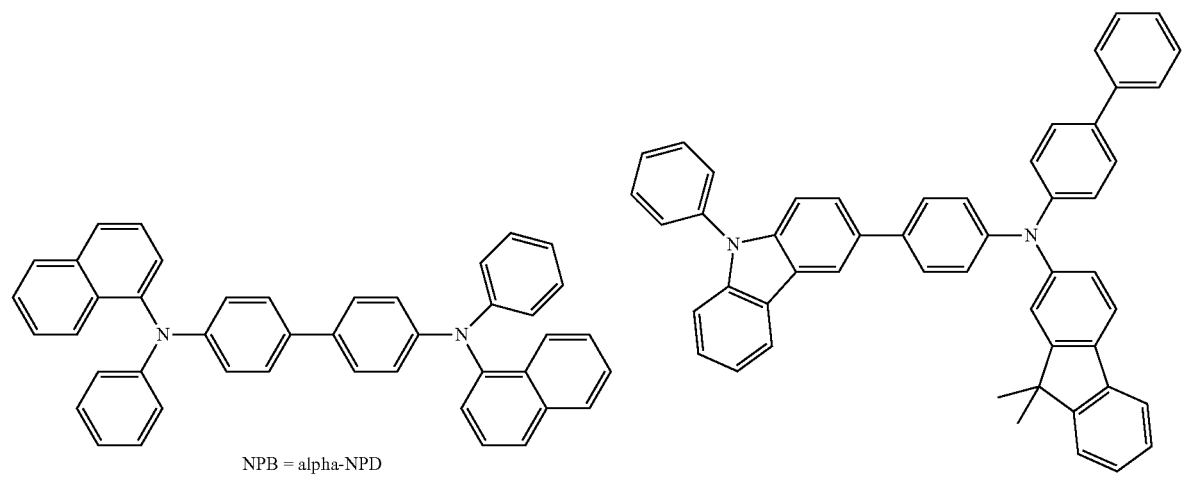
NPB = alpha-NPD
NPB = 4,4'-bis[N-(1-naphthyl)-N-phenylamino]biphenyl
US 2005/0221124, WO 09/041635

-continued

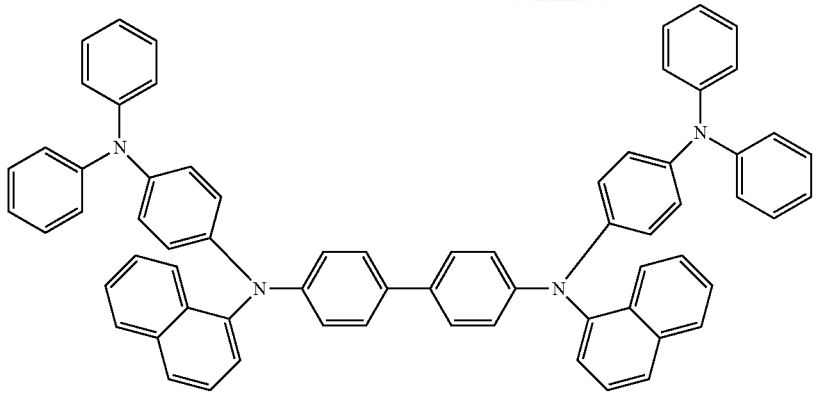

U.S. Pat No. 7,399,537 B2, US 2006 0061265 A1

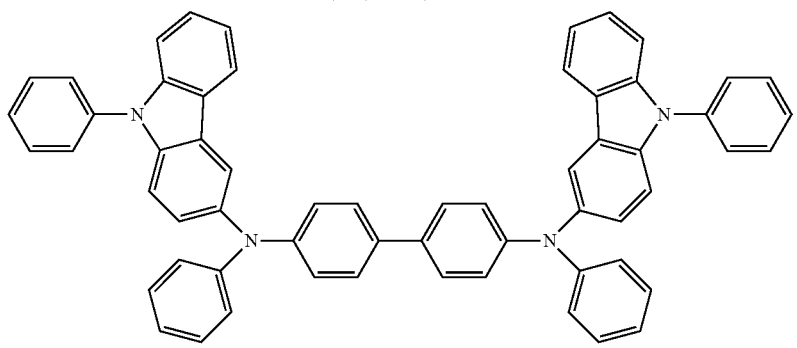

EP 1661888 B1

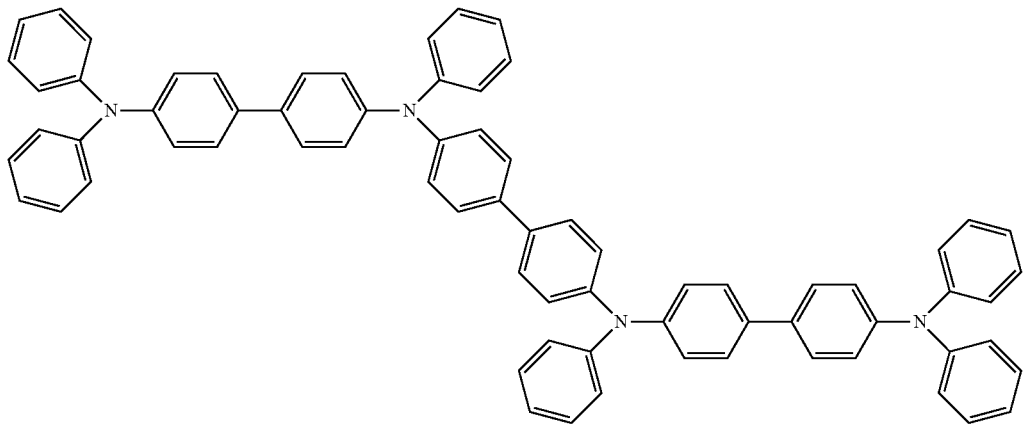

JP 08292586 A

Further structural elements which can be employed as hole-injection materials are described in EP 0891121 A1 and EP 1029909 A1, injection layers in general in US 2004/0174116 A1.

These arylamines and heterocycles which are generally employed as structural elements from group 1 preferably result in an HOMO in the polymer of greater than −5.8 eV (vs. vacuum level), particularly preferably greater than −5.5 eV.

Preferred structural elements from group 1 which have hole-injection and/or hole-transport properties are triarylamine, triarylphosphine and carbazole derivatives. Particular preference is given to triphenylamine, triphenylphophine and n-phenylcarbazole derivatives. A derivative of a structural unit in the present application is taken to mean the structural unit which is unsubstituted or substituted by one or more radicals $R^1$. $R^1$ here can adopt the meanings indicated in relation to the unit of the general formula (III). The preferred and particularly preferred structural elements here can be employed both as units of the general formula (I) and also as units of the general formula (II).

Structural elements from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, triphenylene, ketone, phosphine oxide and phenazine derivatives, but also triarylboranes and further O-, S- or N-containing heterocycles having a low LUMO (LUMO=lowest unoccupied molecular orbital).

Particularly suitable structural elements for electron-transporting and electron-injecting layers are metal chelates of 8-hydroxyquinoline (for example LiQ, AlQ₃, GaQ₃, MgQ₂, ZnQ₂, InQ₃, ZrQ₄), BAlQ, Ga oxinoid complexes, 4-azaphenanthren-5-ol-Be complexes (U.S. Pat. No. 5,529,853 A),

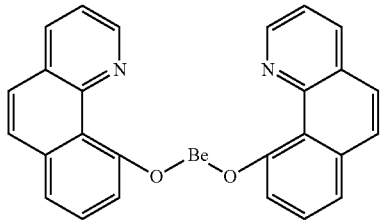

butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779),

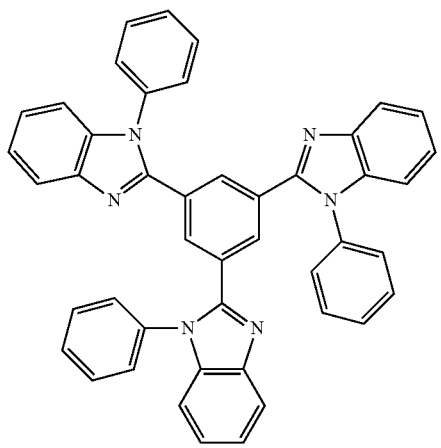

2,2′,2″-(1,3,5-benzentriyl) tris(1-phenyl-1H-benzimidazole)

TPBI 1,3,5-triazines, for example spirobifluorenyltriazine derivatives (for example in accordance with DE 102008064200), pyrenes, anthracenes, tetracenes, fluorenes, spirofluorenes, dendrimers, tetracenes (for example rubrene derivatives), 1,10-phenanthroline derivatives (JP 2003-115387, JP 2004-311184, JP-2001-267080, WO 2002/043449), silacyclopentadiene derivatives (EP 1480280, EP 1478032, EP 1469533), borane derivatives, such as, for example, triarylborane derivatives containing Si,

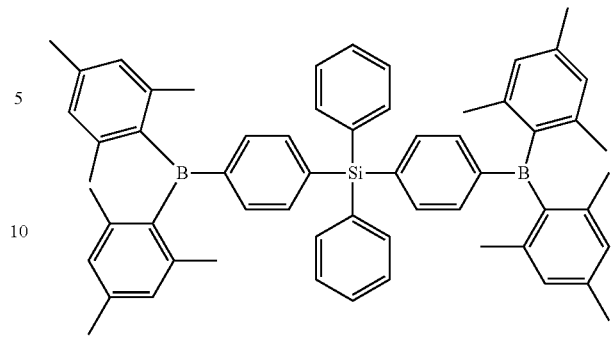

US 2007/0087219 A1 pyridine derivatives (JP 2004-200162), phenanthrolines, especially 1,10-phenanthroline derivatives, such as, for example, BCP and Bphen, also several phenanthrolines connected via biphenyl or other aromatic groups (US-2007-0252517 A1) or phenanthrolines connected to anthracene (US 2007-0122656 A1).

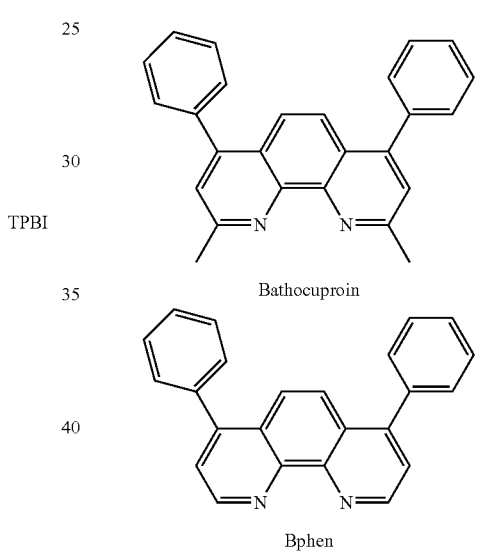

Bathocuproin

Bphen

Likewise suitable are heterocyclic organic compounds, such as, for example, thiopyran dioxides, oxazoles, triazoles, imidazoles or oxadiazoles. Examples of the use of five-membered rings containing N, such as, for example, oxazoles, thiazoles, oxadiazoles, thiadiazoles, triazoles, inter alia, see US 2008/0102311 A1. Preferred compounds are the following:
triazoles, for example

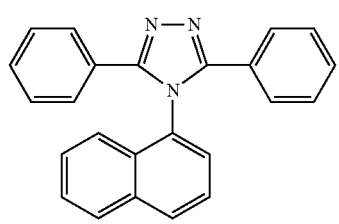 [SMILES: c1ccc(-c2nnc(-c3ccccc3)n2-c2cccc3ccccc23)cc1]

Y. A. Levin, M. S. Skorobogatova, Khimiya Geterotsiklicheskikh Soedinenii 1967 (2), 339-341.

1,3,4-oxadiazoles, for example

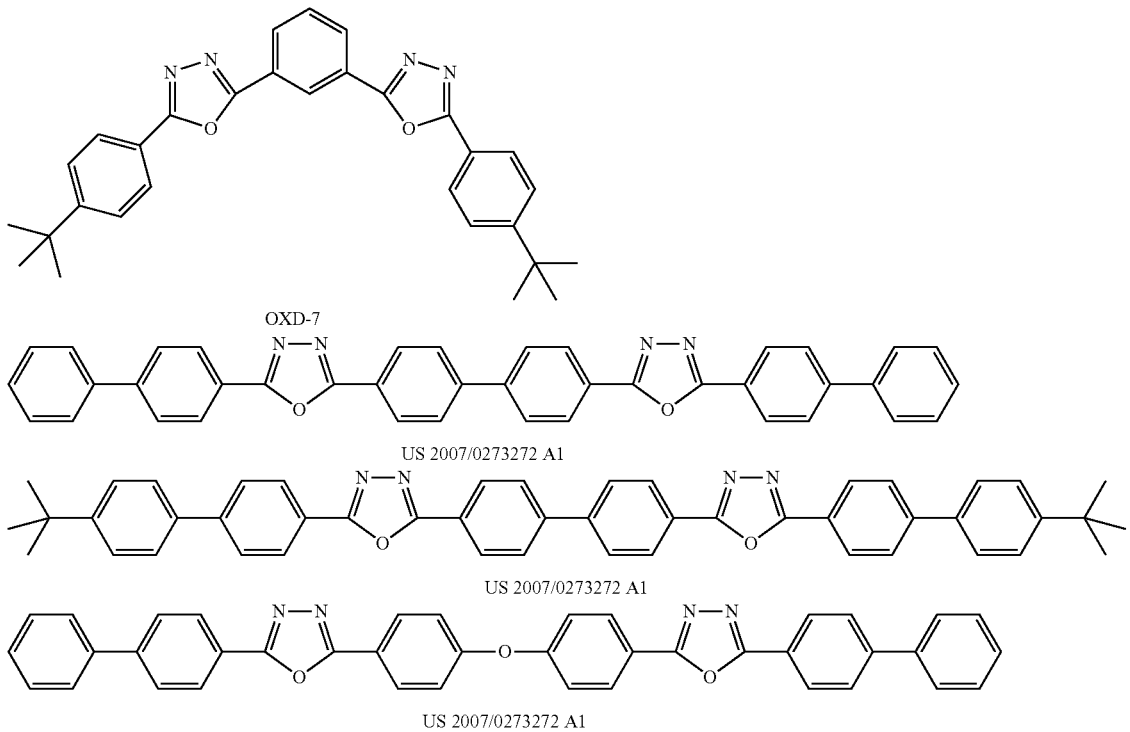

It is also possible to employ organic compounds, such as derivatives of fluorenone, fluorenylidenemethane, perylenetaetracarbonic acid, anthraquinonedimethane, diphenoquinone, anthrone and anthraquinonediethylenediamine.

Preference is given to 2,9,10-substituted anthracenes (with 1- or 2-naphthyl and 4- or 3-biphenyl) or molecules which contain two anthracene units (US2008/0193796 A1). Also very advantageous is the connection of 9,10-substituted anthracene units to benzimidazole derivatives.

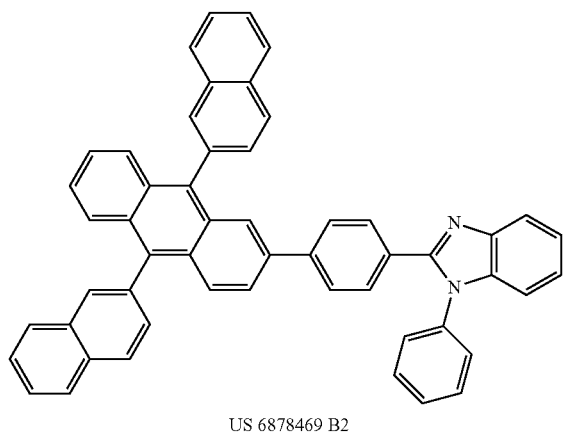

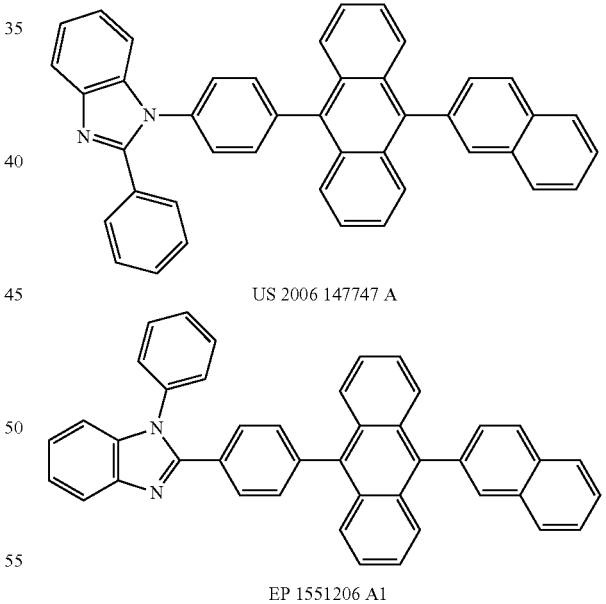

The structural elements from group 2 in a compound of the formula (I) to be employed in accordance with the invention preferably result in an LUMO of less than −2.5 eV (vs. vacuum level), particularly preferably less than −2.7 eV.

Preferred structural elements from group 2 which have electron-injection and/or electron-transport properties are triazine, triphenylene and benzimidazole derivatives. A derivative of a structural unit in the present application is taken to mean the structural unit which is unsubstituted or substituted by one or more radicals $R^1$. $R^1$ here can adopt the meanings indicated in relation to the unit of the general formula (III). The preferred structural elements here can be employed both as units of the general formula (I) and also as units of the general formula (II).

Structural elements from group 3 are those which are able to emit light. These include, inter alia, compounds containing stilbene, stilbenamine, styrylamine, coumarine, rubrene, rhodamine, thiazole, thiadiazole, cyanine, thiophene, praraphenylene, perylene, phatalocyanine, porphyrin, ketone, quinoline, imine, anthracene and/or pyrene structures. Particular preference is given to compounds which are able to emit light from the triplet state with high efficiency, even at room temperature, i.e. exhibit electrophosphorescence instead of electrofluorescence, which frequently causes an Increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural elements which contain elements from group 8 to 10 (Ru, Os, Rh, Ir, Pd, Pt). Suitable functional structural elements A for the compounds of the formula (I) here are, for example, various complexes, as described, for example, in WO 02/068435 A1, WO 02/081488 A1, EP 1239526 A2 and WO 04/026886 A2.

Preferred structural elements which can serve as fluorescent emitters are described by way of example below. Preferred structural elements from group 3 are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred structural elements from group 3 are selected from indenofluorenamines or indenofluorenediamines, for example in accordance with WO 06/122630, benzoindenofluorenamines or benzoindenofluorenediamines, for example in accordance with WO 08/006449, and dibenzoindenofluorenamines or dibenzoindenofluorenediamines, for example in accordance with WO 07/140847.

Examples of structural elements from group 3 from the class of the styrylamines are substituted or unsubstituted tristilbenamines or the dopants described in WO 06/000388, WO 06/058737, WO 06/000389, WO 07/065549 and WO 07/115610. Distyrylbenzene and distyrylbiphenyl derivatives are described in U.S. Pat. No. 5,121,029. Further styrylamines can be found in US 2007/0122656 A1.

Particularly preferred styrylamine structural elements from group 3 are:

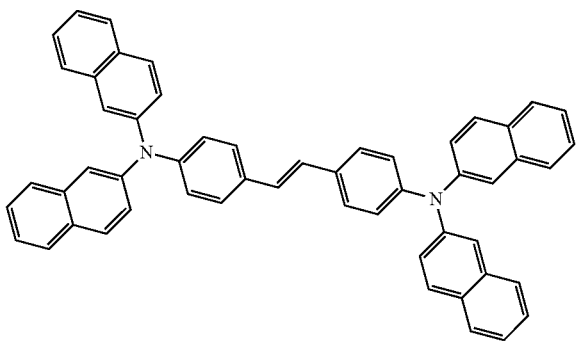

US 7250532 B2

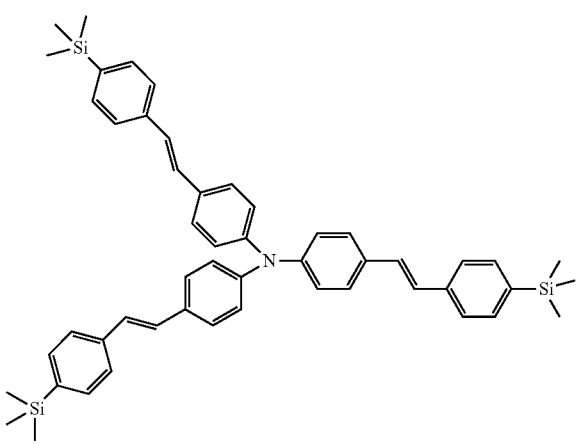

DE 10 2005 058557 A1

Particularly preferred triarylamine structural elements from group 3 are:
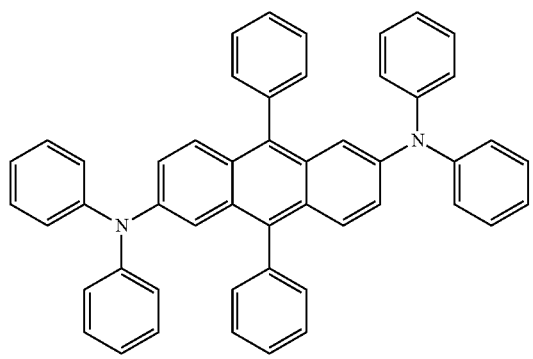
CN 1583691 A
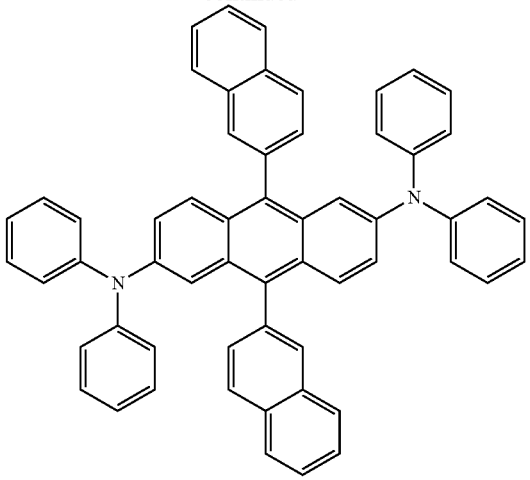
CN 1583691 A
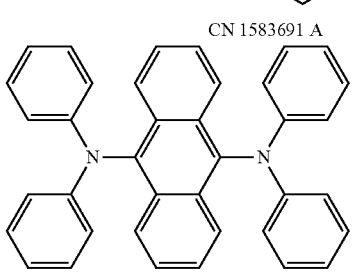
JP 08/053397 A and U.S. Pat. No. 6,251,531 B1, derivatives in EP 1957606 A1 and US 2008/0113101 A1.
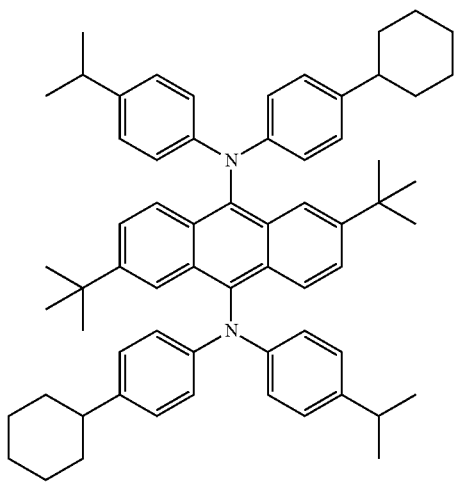
EP 1957606 A1
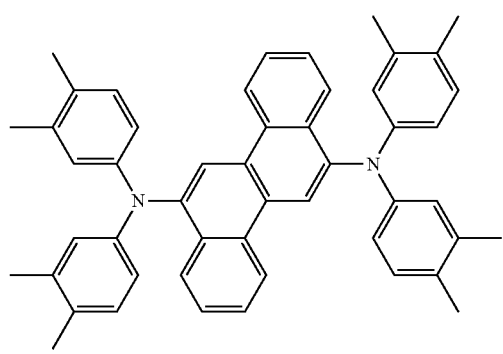
US 2006/210830A -continued
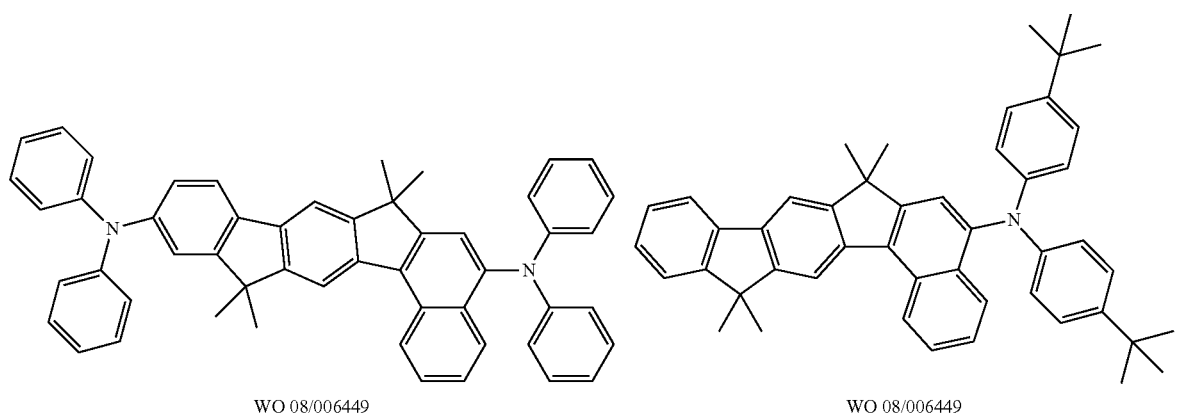
WO 08/006449
WO 08/006449
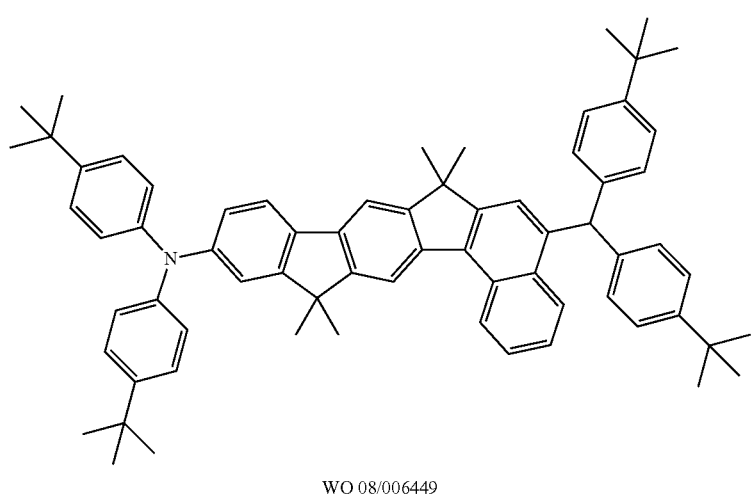
WO 08/006449
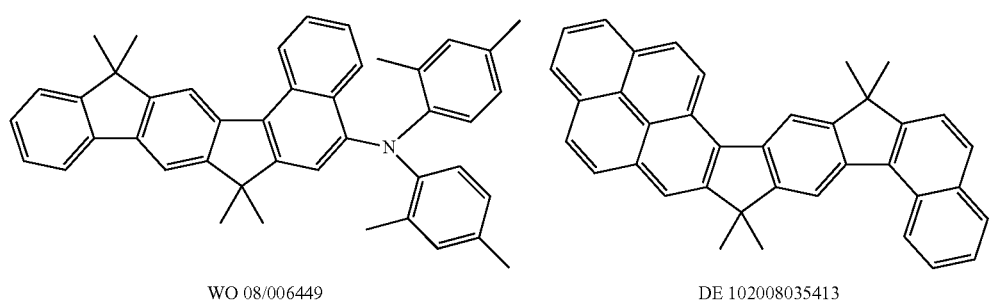
WO 08/006449
DE 102008035413
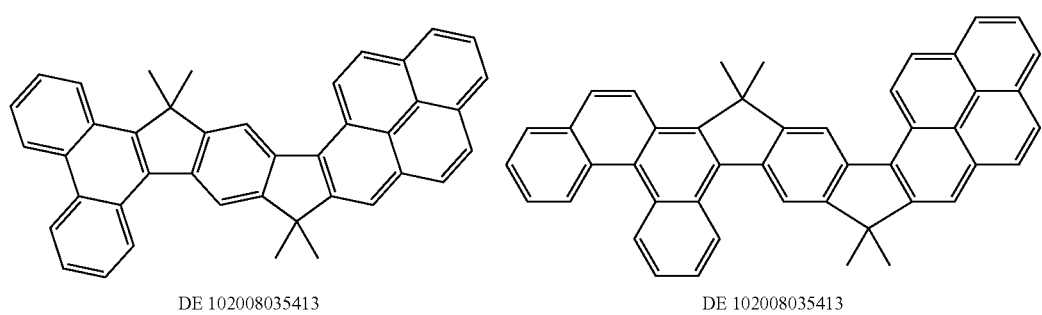
DE 102008035413
DE 102008035413

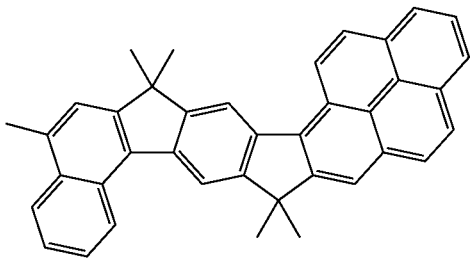

DE 102008035413

Further preferred structural elements from group 3 are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazole, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)benzene is also a preferred dopant.

Preference is likewise given to derivatives of rubrene, coumarine, rhodamine, quinacridone, such as, for example, DMQA (=N,N'-dimethylquinacridone), dicyanomethylenepyran, such as, for example, DCM (=4-(dicyanoethylene)-6-(4-dimethylaminostyryl-2-methyl)-4H-pyran), thiopyran, polymethine, pyrylium and thiapyrylium salts, periflanthene and indenoperylene.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130,603), bis(azinyl)imine-boron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macromol. Symp. 125, (1997) 1-48 and "Recent progress of molecular organic electroluminescent materials and devices" Mat. Sci. and Eng. R, 39 (2002), 143-222.

Further preferred blue-fluorescent emitters are the hydrocarbons disclosed in DE 102008035413.

Preferred structural elements from group 3 which can serve as phosphorescent emitters are depicted by way of example below.

Examples of phosphorescent emitters are revealed by WO 00/70655, WO 01/41512, WO 02/02714, WO 02/15645, EP 1191613, EP 1191612, EP 1191614 and WO 05/033244. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example by fluoro, cyano and/or trifluoromethyl substituents for blue. Auxiliary ligands are preferably acetylacetonate or picolinic acid.

Particularly suitable are complexes of Pt or Pd with tetradentate ligands,

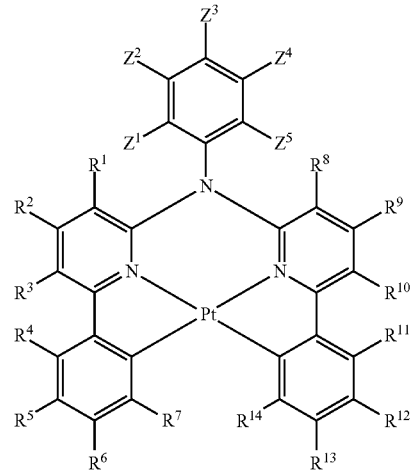

(US 2007/0087219 A1, where, for disclosure purposes, reference is made to this specification for an explanation of the substituents and indices in the above formula), Pt-porphyrin complexes having an enlarged ring system (US 2009/0061681 A1) and Ir complexes, for example 2,3,7,8,12,13,17,18-octaethyl-21H, 23H-porphyrin-Pt(II), tetraphenyl-Pt(II) tetrabenzoporphyrin (US 2009/0061681 A1), cis-bis(2-phenylpyridinato-N,$C^{2'}$)Pt(II), cis-bis(2-(2'-thienyl)pyridinato-N,$C^{3'}$)Pt(II), cis-bis(2-(2'-thienyl)quinolinato-N, $C^{5'}$)Pt(II), (2-(4,6-difluorophenyl)pyridinato-N,$C^{2'}$)Pt(II) (acetylacetonate), or tris(2-phenylpyridinato-N,$C^{2'}$)Ir(III) (=Ir(ppy)$_3$, green), bis(2-phenylpyridinato-N,$C^{2'}$)Ir(III) (acetylacetonate) (=Ir(ppy)$_2$ acetylacetonate, green, US 2001/0053462 A1, Baldo, Thompson et al. Nature 403, (2000), 750-753), bis(1-phenylisoquinolinato-N,$C^{2'}$)(2-phenylpyridinato-N,$C^{2'}$)iridium(III), bis(2-phenylpyridinato-N, $C^{2'}$)(1-phenylisoquinolinato-N,$C^{2'}$)iridium(III), bis(2-(2'- benzothienyl)pyridinato-N,C$^{3'}$)iridium(III) (acetylacetonate), bis(2-(4',6'-difluorophenyl)pyridinato-N,C$^{2'}$)iridium(III) (piccolinate) (FIrpic, blue), bis(2-(4',6'-difluorophenyl)pyridinato-N,C$^{2'}$)Ir(III) (tetrakis(1 pyrazolyl) borate), tris(2-(biphenyl-3-yl)-4-tert-butylpyridine)iridium (III), (ppz)$_2$Ir(5phdpym) (US 2009/0061681 A1), (45ooppz)$_2$ Ir(5phdpym) (US 2009/0061681 A1), derivatives of 2-phenylpyridine-Ir complexes, such as, for example, PQIr (=iridium(III) bis(2-phenylquinolyl-N,C$^{2'}$) acetylacetonate), tris(2-phenylisoquinolinato-N,C)Ir(III) (red), bis(2-(2'-benzo[4,5-a]thienyl)pyridinato-N,C$^3$)Ir (acetylacetonate) ([Btp$_2$Ir(acac)], red, Adachi et al. *Appl. Phys. Left.* 78 (2001), 1622-1624).

Likewise suitable are complexes of trivalent lanthanides, such as, for example, Tb$^{3+}$ and Eu$^{3+}$ (J. Kido et al. *Appl. Phys. Lett.* 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., *JACS* 105, 1983, 1795), Re(I) tricarbonyl-diimine complexes (Wrighton, *JACS* 96, 1974, 998, inter alia), Os(III) complexes with cyano ligands and bipyridyl or phenanthroline ligands (Ma et al., *Synth. Metals* 94, 1998, 245).

Further phosphorescent emitters having tridentate ligands are described in U.S. Pat. Nos. 6,824,895 and 10/729,238. Red-emitting phosphorescent complexes are found in U.S. Pat. Nos. 6,835,469 and 6,830,828.

Particularly preferred structural elements which are used as phosphorescent dopants are:

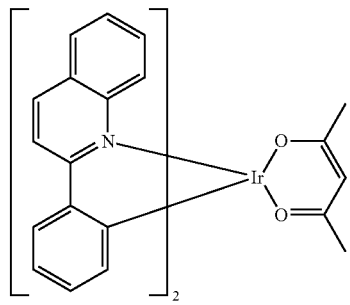

US 2001/0053462 A1 and *Inorg. Chem.* 2001, 40(7), 1704-1711, JACS 2001, 123(18), 4304-4312.

Derivatives are described in U.S. Pat. Nos. 7,378,162 B2, 6,835,469 B2 and JP 2003/253145 A.

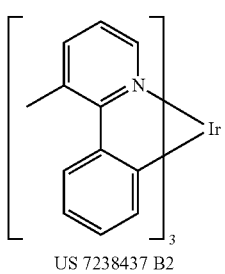

US 7238437 B2

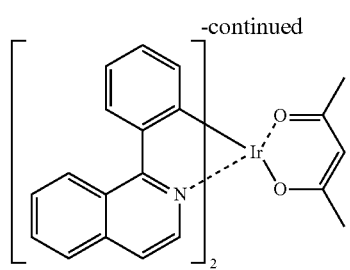

US 2009/008607 A1

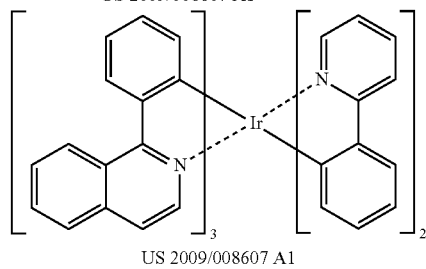

US 2009/008607 A1

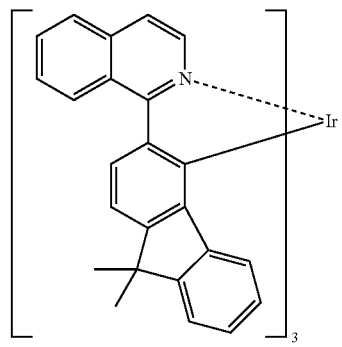

EP 1348711

Preferred structural elements from group 3 which can emit light are units of the formulae (V-Ia), (V-Ib), (V-Ic) and (V-Id)

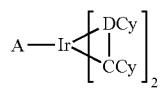

formula V-Ia

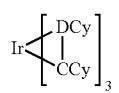

formula V-Ib

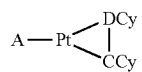

formula V-Ic

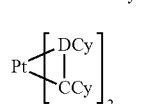

formula V-Id where the following applies to the symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents R$^{10}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{10}$;

A is, identically or differently on each occurrence, a monoanionic, bidentate-chelating ligand, preferably a diketonate ligand;

$R^{10}$ is on each occurrence, identically or differently, H, D, F, Cl, Br, I, CHO, $C(=O)Ar^3$, $P(=O)(Ar^3)_2$, $S(=O)Ar^3$, $S(=O)_2Ar^3$, $CR^{11}=CR^{11}Ar^3$, CN, $NO_2$, $Si(R^{11})_3$, $B(OR^{11})_2$, $B(R^{11})_2$, $B(N(R^{11})_2)_2$, $OSO_2R^{11}$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^{11}$, where one or more non-adjacent $CH_2$ groups may be replaced by $R^{11}C=CR^{11}$, $C\equiv C$, $Si(R^{11})_2$, $Ge(R^{11})_2$, $Sn(R^{11})_2$, $C=O$, $C=S$, $C=Se$, $C=NR^{11}$, $P(=O)(R^{11})$, SO, $SO_2$, $NR^{11}$, O, S or $CONR^{11}$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^{11}$, or an aryloxy or heteroaryloxy group having 5 to 60 aromatic ring atoms, which may be substituted by one or more radicals $R^{11}$, or a combination of these systems; two or more adjacent substituents $R^{10}$ here may also form a mono- or polycyclic, aliphatic or aromatic ring system with one another;

$Ar^3$ is on each occurrence, identically or differently, an aromatic or heteroaromatic ring system having 5 to 40 aromatic ring atoms, which may be substituted by one or more radicals $R^{11}$;

$R^{11}$ is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents $R^{11}$ here may also form a mono- or polycyclic, aliphatic or aromatic ring system with one another, where at least one of the said radicals DCy, CCy and/or A includes at least one group of the formula (L-I) and/or (L-II).

Due to the formation of ring systems between a plurality of radicals $R^{10}$, a bridge may also be present between the groups DCy and CCy here. Furthermore, due to the formation of ring systems between a plurality of radicals $R^{10}$, a bridge may also be present between two or three ligands CCy-DCy or between one or two ligands CCy-DCy and the ligand A, resulting in a polydentate or polypodal ligand system.

The preferred structural elements from group 3 can be employed here both as units of the general formula (I) and also as units of the general formula (II), but they are particularly preferably employed as units of the general formula (II).

Structural elements from group 4 which are employed as host materials, in particular together with emitting compounds, include materials from various classes of substance.

Preferred structural elements from group 4 which are employed, in particular, together with fluorescent dopants are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, anthracene, benzanthracene, benzophenanthrene (DE 10 2009 005746, WO 09/069566), phenanthrene, tetracene, coronene, chrysene, fluorene, spirofluorene, perylene, phthaloperylene, naphthaloperylene, decacyclene, rubrene, the oligoarylenevinylenes (for example DPVBi=4, 4'-bis(2,2-diphenylethenyl)-1,1'-biphenyl or spiro-DPVBi in accordance with EP 676461), the polypodal metal complexes (for example in accordance with WO 04/081017), in particular metal complexes of 8-hydroxyquinoline, for example $AlQ_3$ (=aluminium(III) tris(8-hydroxyquinoline)) or bis(2-methyl-8-quinolinolato)-4-(phenylphenolinolato) aluminium, also with imidazole chelate (US 2007/0092753 A1) and the quinoline-metal complexes, aminoquinoline-metal complexes, benzoquinoline-metal complexes, the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 086/117052) or the benzanthracenes (for example in accordance with WO 08/145239).

Particularly preferred structural elements from group 4 are selected from the classes of the oligoarylenes, comprising anthracene, benzanthracene and/or pyrene, or atropisomers of these compounds. An oligoarylene in the sense of the present invention is intended to be taken to mean a compound in which at least three aryl or arylene groups are bonded to one another.

Preferred host materials are selected, in particular, from compounds of the formula (H-1),

$$Ar^3-(Ar^4)_p-Ar^5 \qquad (H-1)$$

where $Ar^3$, $Ar^4$, $Ar^5$ is on each occurrence, identically or differently, an aryl or heteroaryl group having 5 to 30 aromatic ring atoms, which may be substituted by one or more radicals $R^1$, and $R^1$ has the same meaning as described above, and p represents an integer in the range from 1 to 5; the sum of the π electrons in $Ar^3$, $Ar^4$ and $Ar^5$ is at least 30 if p=1 and at least 36 if p=2 and at least 42 if p=3.

In the compounds of the formula (H-1), the group $Ar^4$ particularly preferably stands for anthracene, which may be substituted by one or more radicals $R^1$, and the groups $Ar^3$ and $Ar^b$ are bonded in the 9- and 10-position. Very particularly preferably, at least one of the groups $Ar^3$ and/or $Ar^5$ is a condensed aryl group selected from 1- or 2-naphthyl, 2-, 3- or 9-phenanthrenyl or 2-, 3-, 4-, 5-, 6- or 7-benzanthracenyl, each of which may be substituted by one or more radicals $R^1$. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadienes, tetraphenylcyclopentadiene, pentaphenylcyclopentadiene, coumarine, oxadiazole, bisbenzoxazoline, oxazole, pyridine, pyrazine, Imine, benzothiazole, benzoxazole, benzimidazole (US 2007/0092753 A1), for example 2,2',2"-(1,3,5-phenylene) tris[1-phenyl-1H-benzimidazole], aldazine, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB (=4,4'-bis[N-(1-naphthyl)-N-(2-naphthyl)amino]biphenyl). Metal-oxinoid complexes, such as UQ or AlQ$_3$, can be used as co-hosts.

Preferred compound with oligoarylene as matrix:

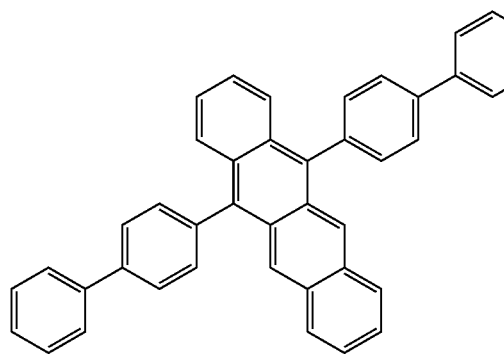

US 2003/0027016 A1

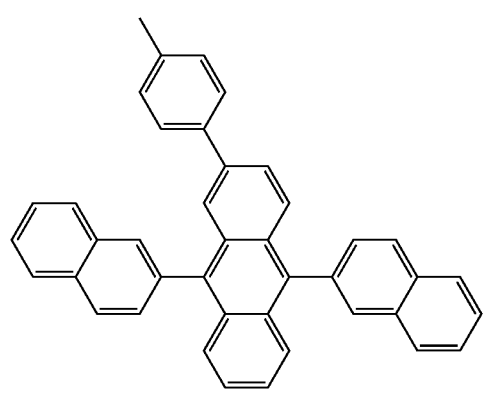

U.S. Pat. No. 7,326,371 B2

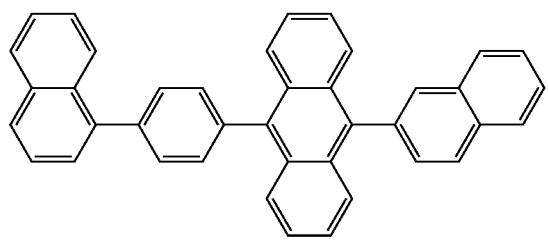

US 2006/043858 A

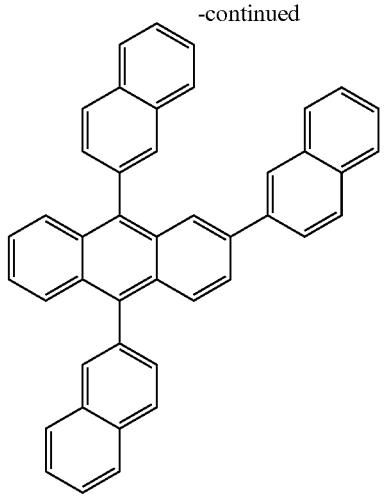

U.S. Pat. No. 7,326,371 B2

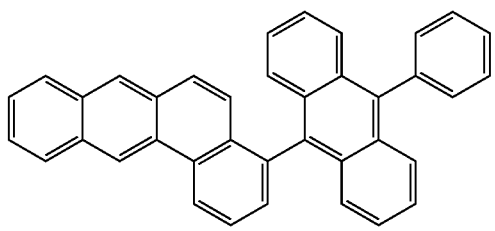

WO 08/145239

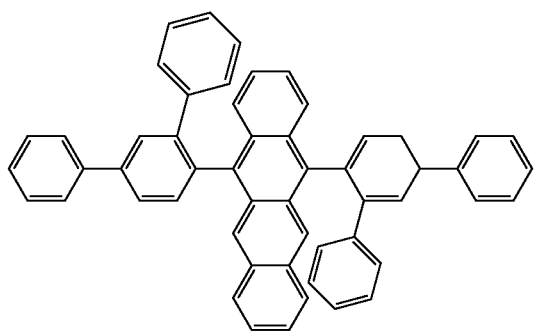

US 2003/0027016 A1

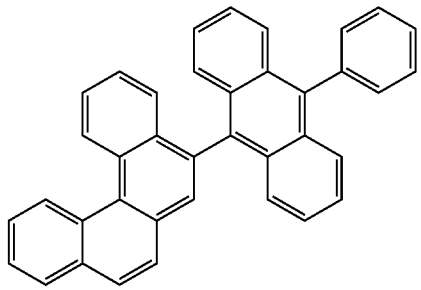

DE 102009005746

Furthermore, structural elements from group 4 include materials which are employed together with phosphorescent emitters. These structural elements include CBP (N,N-bis-carbazolylbiphenyl), carbazole derivatives (for example in accordance with WO 05/039246, US 2005/0069729, JP 2004/288381, EP 1205527 or WO 08/086851), azacarbazoles (for example in accordance with EP 1617710, EP 1617711, EP 1731584, JP 2005/347160), ketones (for example in accordance with WO 04/093207 or in accordance with DE 102008033943), phosphine oxides, sulfoxides and sulfones (for example in accordance with WO 05/003253), oligophenylene, aromatic amines (for example in accordance with US 2005/0069729), bipolar matrix materials (for example in accordance with WO 07/137725), silanes (for example in accordance with WO 05/111172), 9,9-diarylfluorene derivatives (for example in accordance with DE 102008017591), azaboroles or boronic esters (for example in accordance with WO 06/117052), triazine derivatives (for example in accordance with DE 102008036982), indolocarbazole derivatives (for example in accordance with WO 07/063754 or WO 08/056746), indenocarbazole derivatives (for example in accordance with DE 102009023155 and DE 102009031021), diazaphosphole derivatives (for example in accordance with DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, which may also contain triarylaminophenol ligands (US 2007/0134514 A1), metal complex/polysilane compounds, and thiophene, benzothiophene and dibenzothiophene derivatives.

Examples of preferred carbazole structural elements are mCP (=1,3-N,N'-dicarbazolyl)benzene (=9,9'-(1,3-phenylene)bis-9H-carbazole)), CDBP (=9,9'-(2,2'-dimethyl[1,1'-biphenyl]-4,4'-diyl)bis-9H-carbazole), 1,3-bis(N,N'-dicarbazolyl)benzene (=1,3-bis(carbazol-9-yl)benzene), PVK (polyvinylcarbazole), 3,5-di(9H-carbazol-9-yl)biphenyl, and the compounds depicted below.

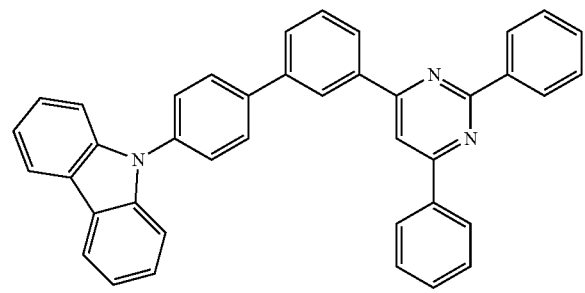

mCP

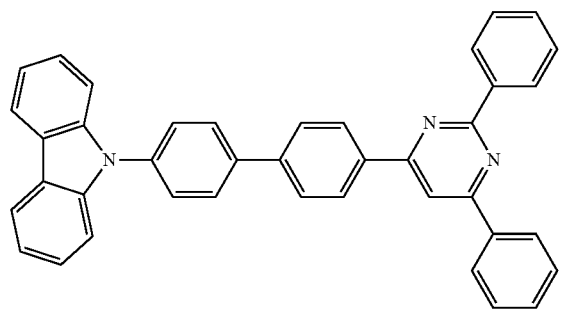

US 2005/0249976 A1

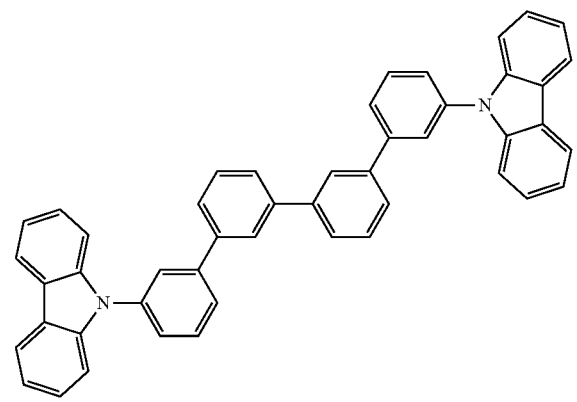

CMTTP

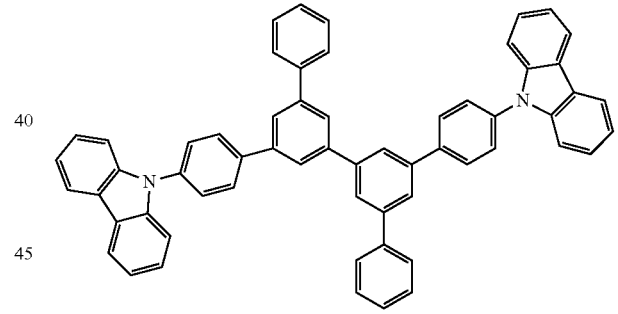

US 2007/0128467 A1

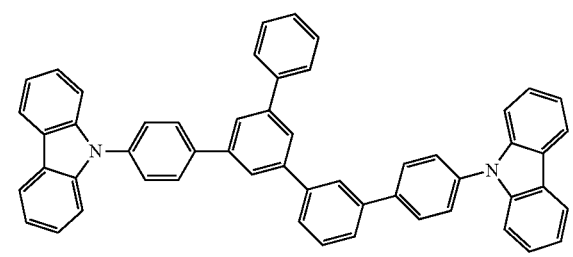

US 2007/0128467 A1

Preferred Si tetraaryl compounds are, for example, (US 2004/0209115, US 2004/0209116)

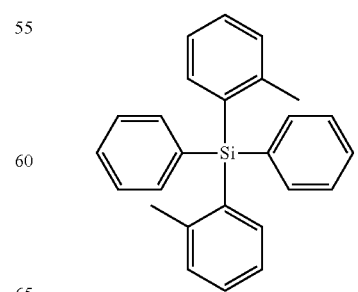

UGH1

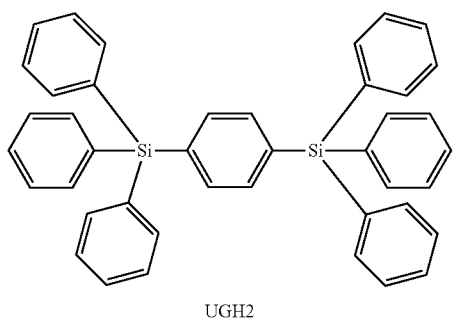
UGH2
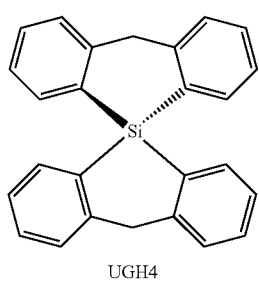
UGH4
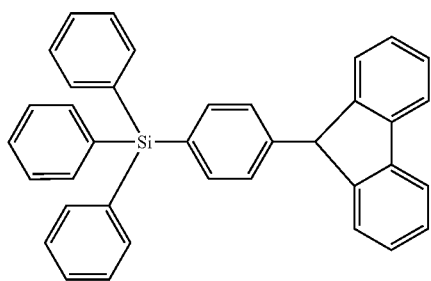
TPSi-F
Triphenyl-[4-(9-phenyl-9H-fluoren-9-yl)phenyl]silane
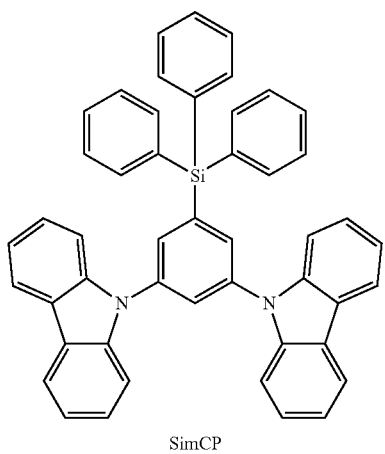
SimCP
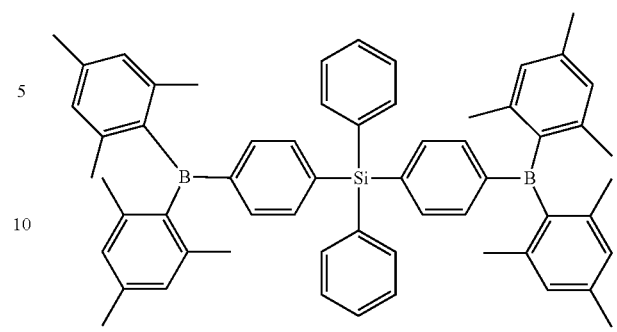
US 2007/0087219 A1
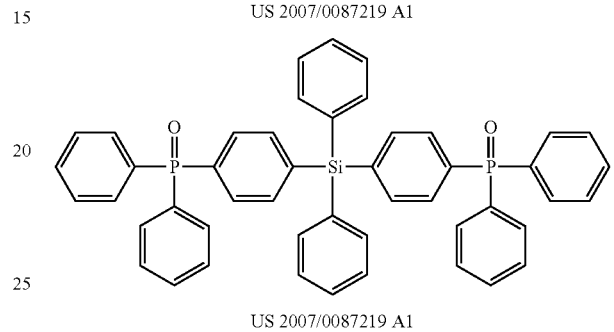
US 2007/0087219 A1
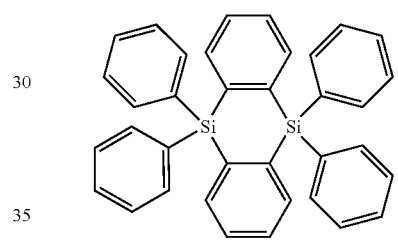
H. Gilman, E. A. Zuech, Chemistry & Industry (London, United Kingdom), 1960, 120.
Particularly preferred structural elements from group 4 for the preparation of the matrix for phosphorescent dopants are:
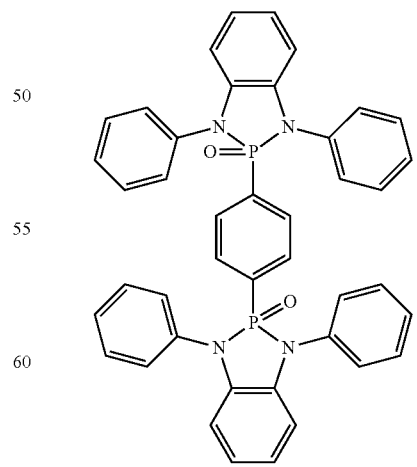
DE 102009022858

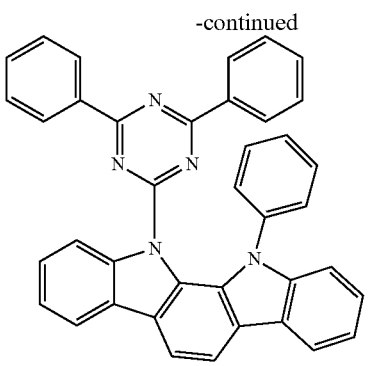

WO 07/063754 and WO 08/056746

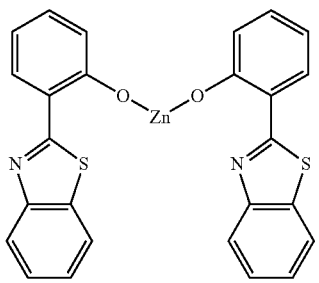

EP 652273 B1

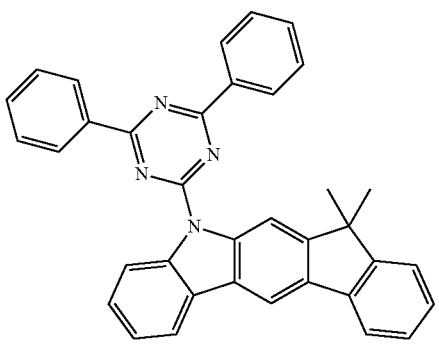

DE 102009023155

With respect to the functional compounds which can be employed in accordance with the invention and which can serve as host material, particular preference is given to substances whose functional structural element A has at least one nitrogen atom. These preferably include aromatic amines, triazine derivatives and carbazole derivatives. Thus, carbazole derivatives in particular exhibit surprisingly high efficiency. Triazine derivatives unexpectedly result in long lifetimes of the electronic devices comprising the said compounds.

The preferred and particularly preferred structural elements from group 4 which are employed as host materials may be unsubstituted or substituted by one or more radicals $R^1$ here. $R^1$ here can adopt the meanings indicated in relation to the unit of the general formula (III).

The preferred and particularly preferred structural elements from group 4 can be employed here both as units of the general formula (I) and also as units of the general formula (II), but they are particularly preferably employed as units of the general formula (II).

Structural elements from group 5 are those which improve the transfer from the singlet state to the triplet state and which, employed in support of the functional structural elements from group 3, improve the phosphorescence properties of these structural elements. Suitable for this purpose are, in particular, carbazole and bridged carbazole dimer units, as described, for example, in WO 04/070772 A2 and WO 04/113468 A1. Also suitable for this purpose are ketones, phosphine oxides, sulfoxides, sulfones, silane derivatives and similar compounds, as described, for example, in WO 05/040302 A1.

The structural elements from group 5 may be unsubstituted or substituted by one or more radicals $R^1$. $R^1$ here can adopt the meanings indicated in relation to the unit of the general formula (III). Furthermore, the structural elements from group 5 can be employed both as units of the general formula (I) and also as units of the general formula (II), but they are particularly preferably employed as units of the general formula (II).

The above-cited publications on the description of the functional structural elements are incorporated into the present application for disclosure purposes by way of reference.

In a first preferred embodiment, the units of the general formula (I) are selected from:
  units which have hole-injection and/or hole-transport properties,
  units which have electron-injection and/or electron-transport properties, and
  units which have light-emitting properties and
the units of the general formula (II) are selected from solubility-promoting structural units of the general formula (III).

In this case, the units of the general formula (I) can preferably be connected to at least one solubility-promoting structural unit of the general formula (III) via an aromatic and/or heteroaromatic group. In accordance with a preferred embodiment, the units of the general formula (I) can be connected to one or more solubility-promoting structural units of the general formula (III) via a carbon atom of an aromatic or heteroaromatic ring system.

In a second preferred embodiment, the units of the general formula (I) are selected from solubility-promoting structural units of the general formula (III), and the units of the general formula (II) are selected from:
  units which have hole-injection and/or hole-transport properties,
  units which have electron-injection and/or electron-transport properties, and
  units which have light-emitting properties.

As described above, the hyperbranched polymers according to the invention are characterised in that at least one unit of the general formula (I) or at least one unit of the general formula (II) is selected from a solubility-promoting unit of the general formula (III):

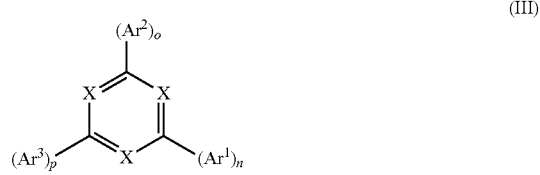

where
Ar$^1$, Ar$^2$, Ar$^3$ is each, independently of one another, an aryl or heteroaryl group, which may be substituted by one or more of any desired radicals $R^1$, X is in each case, independently of one another, N or $CR^2$, preferably CH, $R^1$, $R^2$ is each, independently of one another, hydrogen, a straight-chain alkyl, alkoxy or thioalkoxy group having 1 to 40 C atoms or a branched or cyclic alkyl, alkoxy or thioalkoxy group having 3 to 40 C atoms or a silyl group or a substituted keto group having 1 to 40 C atoms, an alkoxycarbonyl group having 2 to 40 C atoms, an aryloxycarbonyl group having 7 to 40 C atoms, a cyano group (—CN), a carbamoyl group (—C(=O)NH$_2$), a haloformyl group (—C(=O)—X, in which X represents a halogen atom), a formyl group (—C(=O)—H), an isocyano group, an isocyanate group, a thiocyanate group or a thioisocyanate group, a hydroxyl group, a nitro group, a $CF_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups $R^1$ and/or $R^2$ may form a mono- or polycyclic, aliphatic or aromatic ring system with one another and/or with the ring to which the group $R^1$ is bonded, and n, o, p may each, independently of one another, identically or differently, be 0 or 1, where the solubility-promoting unit of the general formula (III) has three bonds to other units of the polymer if it represents a unit of the general formula (I), and the solubility-promoting unit of the general formula (III) has one bond to another unit of the polymer if it represents a unit of the general formula (II).

In the case where n=o=p=0, the solubility-promoting unit preferably represents a unit of the two following formulae (I-IIIa) and (II-IIIa):

(I-IIIa)

(II-IIIa)

where X can adopt the meanings indicated in relation to formula (III).

In this case, the solubility-promoting unit particularly preferably represents a unit of the two following formulae (I-IIIa1) and (II-IIIa1):

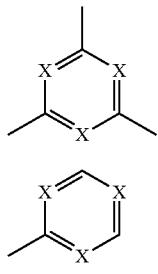

(I-IIIa1)

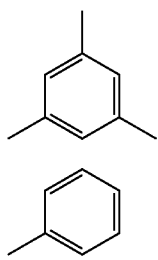

(II-IIIa1)

In the case where n=1 and o=p=0, the solubility-promoting unit preferably represents a unit of the two following formulae (I-IIIb) and (II-IIIb):

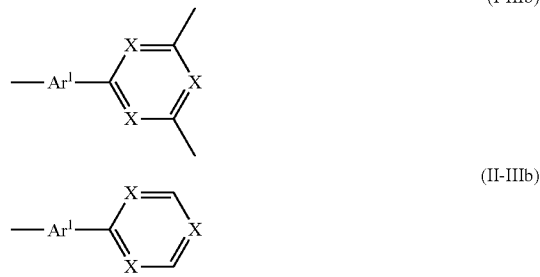

(I-IIIb)

(II-IIIb)

where $Ar^1$ and X can adopt the meanings indicated in relation to formula (III).

In this case, the solubility-promoting unit particularly preferably represents a unit of the two following formulae (I-IIIb1) and (II-IIIb1):

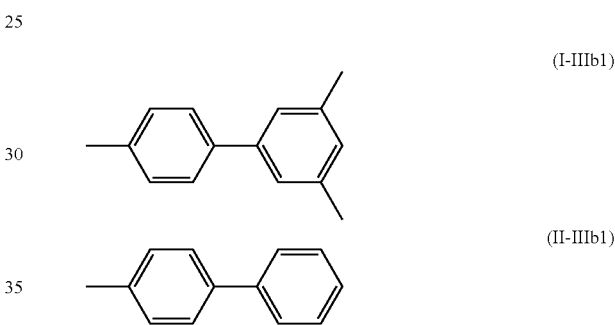

(I-IIIb1)

(II-IIIb1)

In the case where n=0 and o=p=1, the solubility-promoting unit preferably represents a unit of the two following formulae (I-IIIc) and (II-IIIc):

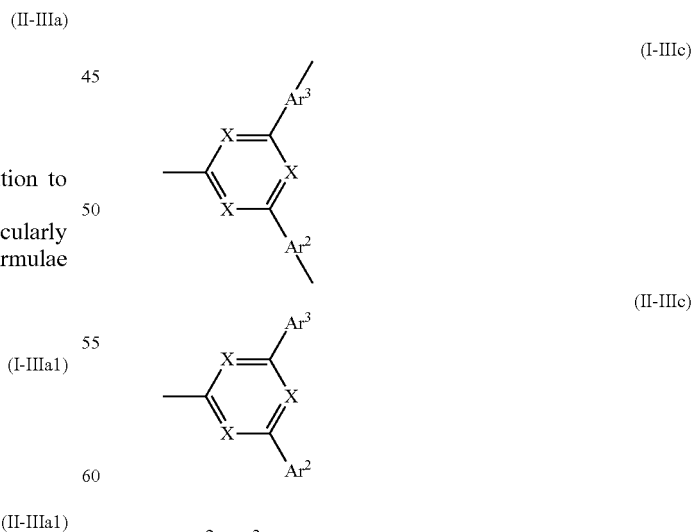

(I-IIIc)

(II-IIIc)

where $Ar^2$, $Ar^3$ and X can adopt the meanings indicated in relation to formula (III).

In this case, the solubility-promoting unit particularly preferably represents a unit of the two following formulae (I-IIIc1) and (II-IIIc1):

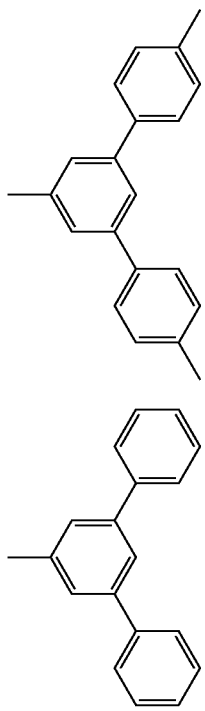

(I-IIIc1)

(II-IIIc1)

In the case where n=o=p=1, the solubility-promoting unit preferably represents a unit of the two following formulae (I-IIId) and (II-IIId):

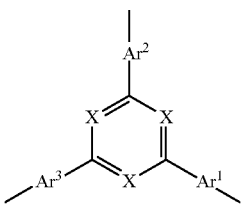

(I-IIId)

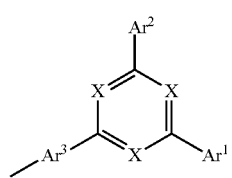

(II-IIId)

where $Ar^1$, $Ar^2$, $Ar^3$ and X can adopt the meanings indicated in relation to formula (III).

In this case, the solubility-promoting unit particularly preferably represents a unit of the two following formulae (I-IIId1) and (II-IIId1):

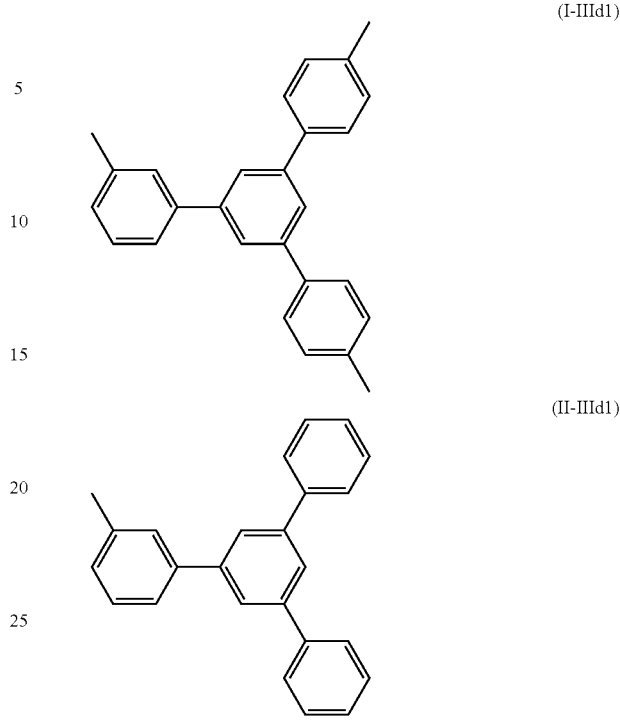

(I-IIId1)

(II-IIId1)

In the above formulae (I-IIIa1), (II-IIIa1), (I-IIIb1), (II-IIIb1b), (I-IIIc1), (II-IIIc1), (I-IIId1) and (II-IIId1), the phenyl groups may be substituted by one or more of any desired radicals $R^1$. The radicals $R^1$ here can adopt the meanings indicated in relation to formula (III).

The solubility-promoting structural unit consequently conforms, for example, to the general formula (II-IIId1) to the general formula (II-IIId2)

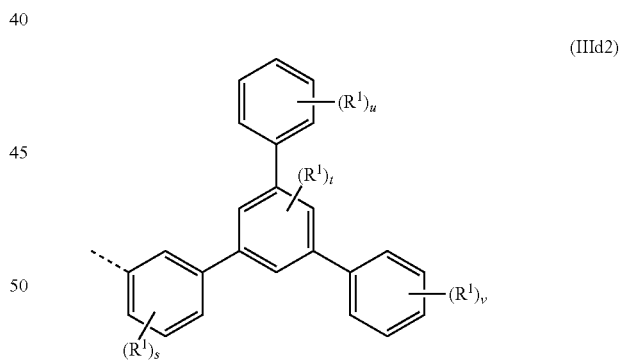

(IIId2)

where $R^1$ is in each case, independently of one another, hydrogen, a straight-chain alkyl, alkenyl, alkoxy or thioalkoxy group having 1 or 2 to 40 C atoms respectively or a branched or cyclic alkyl, alkenyl, alkoxy or thioalkoxy group having 3 to 40 C atoms or is a silyl group or a substituted keto group having 1 to 40 C atoms, an alkoxycarbonyl group having 2 to 40 C atoms, an aryloxycarbonyl group having 7 to 40 C atoms, a formyl group (—C(=O)—H), a $CF_3$ group, Cl, Br, F, a crosslinkable group or a substituted or unsubstituted aromatic or heteroaromatic ring system having 5 to 60 ring atoms, or an aryloxy or heteroaryloxy group having 5 to 60 ring atoms, or a combination of these systems, where one or more of the groups $R^1$, $R^2$, $R^3$ and/or $R^4$ may form a mono- or polycyclic, aliphatic or aromatic ring system with one another and/or with the ring to which the group $R^1$ is bonded;

s is 0, 1, 2, 3 or 4,
t is 0, 1, 2 or 3, and
u, v is each, independently of one another, 0, 1, 2, 3, 4 or 5;
where the dashed bond indicates the bond to a further unit of the hyperbranched polymer.

The radicals $R^1$ particularly preferably represent hydrogen (s, t, u and v=0), a straight-chain alkyl or alkoxy group having 1 to 20 C atoms or a branched alkyl or alkoxy group having 3 to 20 C atoms.

The particularly preferred solubility-promoting structural units of the general formula (II-IIId2) include, inter alia, the following structural elements:

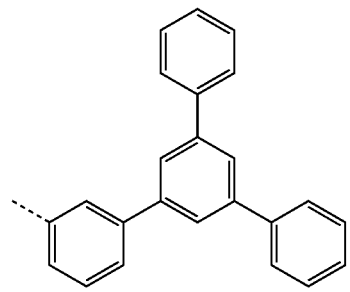
(L-1)

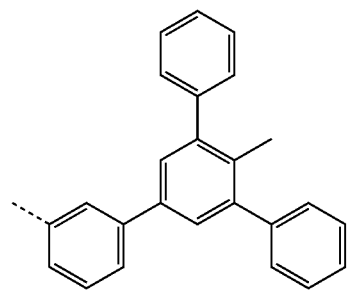
(L-2)

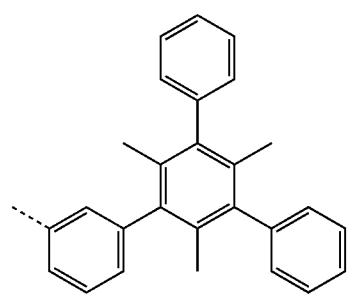
(L-3)

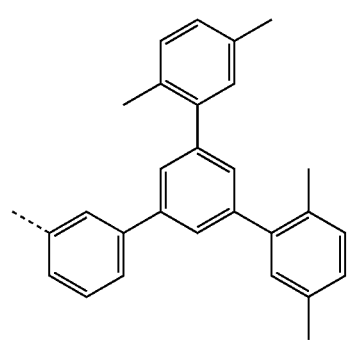
(L-4)

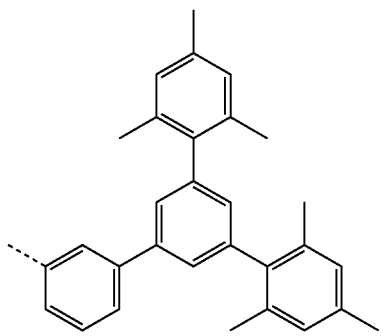
(L-5)

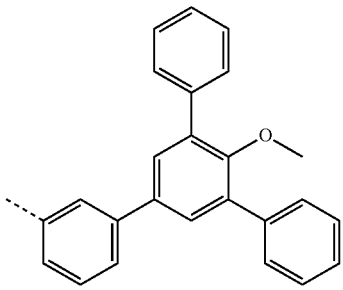
(L-6)

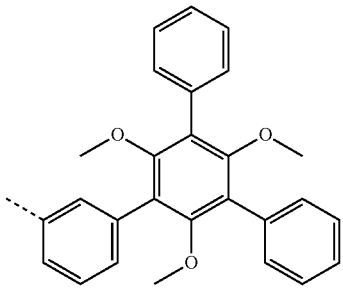
(L-7)

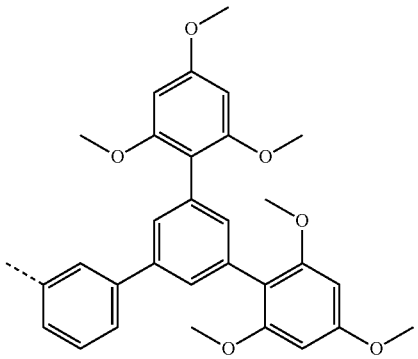
(L-8)

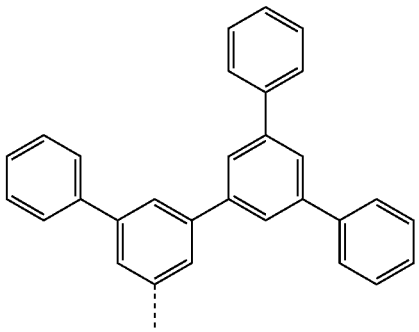
(L-9)

-continued (L-10) 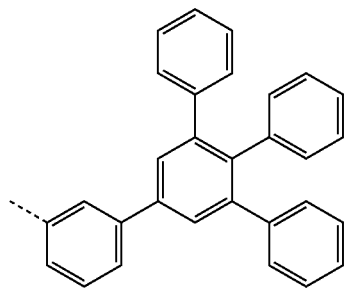

(L-11) 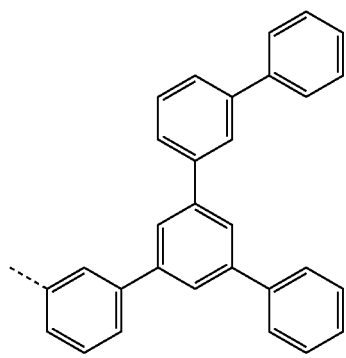

(L-12) 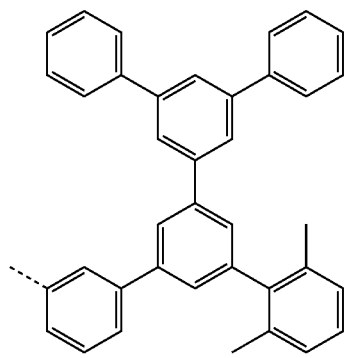

(L-13) 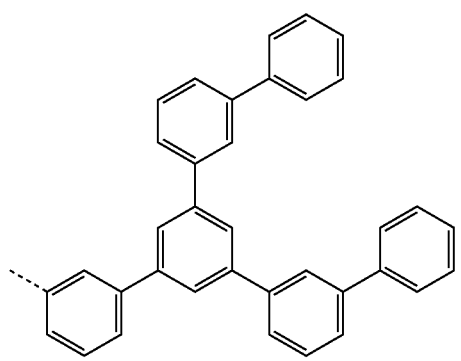

-continued (L-14) 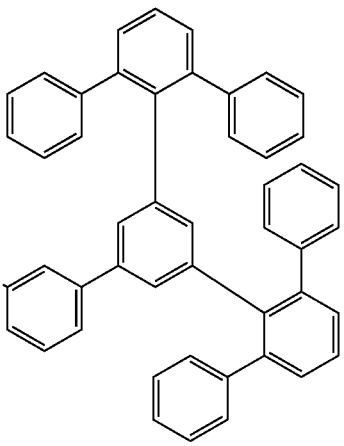

(L-15) 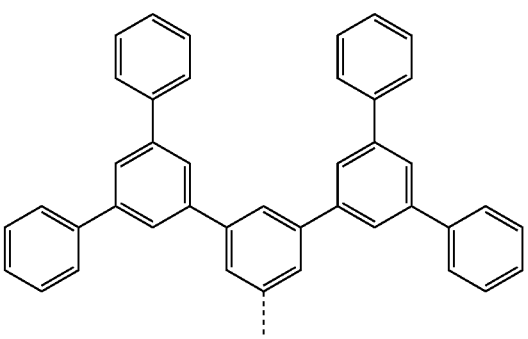

(L-16) 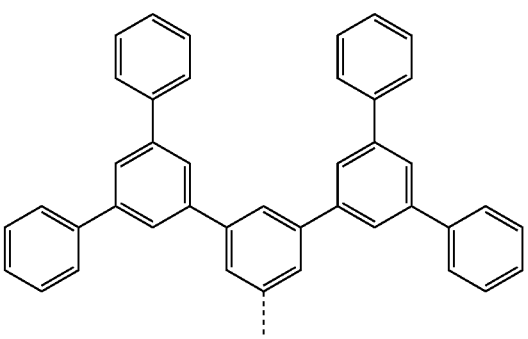

where the dashed bond indicates the bond to a further unit of the hyperbranched polymer.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene. For the purposes of the present invention, particular preference is given to fluorene, spirobifluorene, indenofluorene, anthracene, phenanthrene, dihydrophenanthrene and carbazole.

An aryl group in the sense of the present invention contains 5 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, or a condensed aryl or heteroaryl group, for example naphthalene, anthracene, phenanthrene, quinoline, isoquinoline, benzothiophene, benzofuran and indole.

In the structural units of the general formula (III), it is furthermore preferred for $R^1$ and $R^2$, and $R^1$, $R^2$, $R^3$ and $R^4$ respectively to be selected on each occurrence, independently of one another, from F, Cl, Br, I, $N(Ar)_2$, $N(R')_2$, CN, $NO_2$, $Si(R')_3$, $B(OR')_2$, $C(=O)Ar$, $C(=O)R'$, $P(=O)(Ar)_2$, $P(=O)(R')_2$, $S(=O)Ar$, $S(=O)R'^1$, $S(=O)_2Ar$, $S(=O)_2R'$, $-CR'=CR'Ar$, $OSO_2R'$, a straight-chain alkyl, alkoxy or thioalkoxy group having 1 to 40 C atoms, preferably 1 to 20 C atoms, or a branched or cyclic alkyl, alkoxy or thioalkoxy group having 3 to 40 C atoms, preferably 3 to 20 C atoms, each of which may be substituted by one or more radicals R', where one or more non-adjacent $CH_2$ groups may be replaced by $R'C=CR'$, $C\equiv C$, $Si(R')_2$, $Ge(R')_2$, $Sn(R')_2$, C=O, C=S, C=Se, C=NR', $P(=O)(R')$, SO, $SO_2$, NR', O, S or CONR' and where one or more H atoms may be replaced by F, Cl, Br, I, CN or $NO_2$, a crosslinkable group or an aromatic or heteroaromatic ring system having 5 to 60 ring atoms, which may in each case be substituted by one or more radicals R', or an aryloxy or heteroaryloxy group having 5 to 60 ring atoms, which may be substituted by one or more radicals R', or a combination of these systems, where two or more substituents R may also form a mono- or polycyclic, aliphatic or aromatic ring system with one another, where R is in each case, independently of one another, H or an aliphatic or aromatic hydrocarbon radical having 1 to 20 C atoms, and Ar is an aryl or heteroaryl groups having 2 to 30 C atoms.

The structural units of the general formula (III) may, as described above, contain one or more crosslinkable groups. "Crosslinkable group" means a functional group which is capable of reacting irreversibly. A crosslinked material, which is insoluble, is thereby formed. The crosslinking can usually be supported by heat or by UV, microwave, X-ray or electron radiation. Little by-product formation occurs during the crosslinking here. In addition, the crosslinkable groups which may be present in the functional compounds crosslink very easily, meaning that smaller amounts of energy are necessary for the crosslinking (for example <200° C. in the case of thermal crosslinking).

Examples of crosslinkable groups are units which contain a double bond, a triple bond, a precursor which is capable of in-situ formation of a double or triple bond, or a heterocyclic addition-polymerisable radical. Crosslinkable groups include, inter alia, vinyl, alkenyl, preferably ethenyl and propenyl, $C_{4\text{-}20}$-cycloalkenyl, azide, oxirane, oxetane, di(hydrocarbyl)amino, cyanate ester, hydroxyl, glycidyl ether, $C_{1\text{-}10}$-alkyl acrylate, $C_{1\text{-}10}$-alkyl methacrylate, alkenyloxy, preferably ethenyloxy, perfluoroalkenyloxy, preferably perfluoroethenyloxy, alkynyl, preferably ethynyl, maleimide, tri($C_{1\text{-}4}$)-alkylsiloxy and tri($C_{1\text{-}4}$)-alkylsilyl. Particular preference is given to vinyl and alkenyl. For the purposes of the present invention, an alkyl group having 1 to 40 C atoms, in which, in addition, individual H atoms or $CH_2$ groups may be substituted by the above-mentioned groups or radicals R, is preferably taken to mean the radicals methyl, ethyl, n-propyl, i-propyl, cyclopropyl, n-butyl, i-butyl, s-butyl, t-butyl, cyclobutyl, 2-methylbutyl, n-pentyl, s-pentyl, cyclopentyl, n-hexyl, cydclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy or 2-methylbutoxy.

The present invention furthermore relates to the monomers employed for the preparation of the hyperbranched polymers according to the invention.

To this end, the invention provides a compound of the general formula (VI),

(VI)

where
$A_1$ is a functional structural element,
X is a leaving group which reacts with the leaving group Y, and
Y are leaving groups which are identical or different, preferably identical, and react with the leaving group X.

For the preparation of the hyperbranched polymers according to the invention, the functionalised compounds of the general formula VI are polymerised. This is carried out in the presence of monofunctional compounds which result in units of the general formula (II) in the hyperbranched polymers according to the invention. Suitable polymerisation reactions are known to the person skilled in the art and are described in the literature. Particularly suitable and preferred polymerisation and coupling reactions, all of which result in C—C links, are the SUZUKI, YAMAMOTO, STILLE, HECK, NEGISHI, SONOGASHIRA or HIYAMA reactions. The C—C linking reactions are particularly preferably carried out via a SUZUKI coupling.

The way in which the polymerisation can be carried out by these methods and the way in which the polymers can then be separated off from the reaction medium and purified is known to the person skilled in the art and is described in detail in the literature, for example in WO 03/048225 and WO 04/037887.

In a first particularly preferred embodiment, X is selected from halide or triflate, and Y is selected from boronic acid or boronic acid ester. In a second particularly preferred embodiment, X is selected from boronic acid or boronic acid ester, and Y is selected from halide or triflate. The halide here is selected from F, Cl, Br and I. The halide is particularly preferably bromine.

In a further embodiment of the present invention, the hyperbranched polymers according to the invention are not used as pure substance, but instead as mixture (blend) together with further polymeric, oligomeric, dendritic or low-molecular-weight substances of any desired type. These may, for example, improve the electronic properties or emit themselves. "Mixture" or "blend" above and below denotes a mixture comprising at least one polymeric component.

The present invention thus furthermore relates to a polymer mixture (blend) which comprises one or more hyperbranched polymers according to the invention, and one or more further polymeric, oligomeric, dendritic or low-molecular-weight substances.

The invention furthermore relates to solutions and formulations comprising one or more hyperbranched polymers or mixtures according to the invention in one or more solvents. The way in which such solutions can be prepared is known to the person skilled in the art and is described, for example, in WO 02/072714 A1, WO 03/019694 A2 and the literature cited therein.

These solutions can be used to produce thin polymer layers, for example by area-coating methods (for example spin coating) or by printing processes (for example ink-jet printing).

Hyperbranched polymers containing structural units of the general formula (I) and (II) which contain one or more polymerisable, and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. Particular preference is given for such applications to hyperbranched polymers according to the invention containing one or more polymerisable groups, selected from acrylate, methacrylate, vinyl, epoxy and oxetane. Both corresponding hyperbranched polymers can be used in pure substance here, but it is also possible to use formulations or blends of these hyperbranched polymers as described above. These can be used with or without addition of solvents and/or binders. Suitable materials, processes and devices for the methods described above are disclosed, for example, in WO 2005/083812 A2. Possible binders are, for example, polystyrene, polycarbonate, polyacrylate, polyvinylbutyral and similar, opto-electronically neutral polymers.

Suitable and preferred solvents are, for example, toluene, anisole, xylenes, methyl benzoate, dimethylanisoles, trimethylbenzenes, tetralin, dimethoxybenzenes, tetrahydrofuran, chlorobenzene and dichlorobenzene, as well as mixtures thereof.

The hyperbranched polymers, mixtures and formulations according to the invention can be used in electronic or electro-optical devices or for the production thereof.

The present invention thus furthermore relates to the use of the hyperbranched polymers, mixtures and formulations according to the invention in electronic or electro-optical devices, preferably in organic or polymeric organic electroluminescent devices (OLED, PLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLED, PLED), in particular in polymeric organic electroluminescent devices (PLED).

The way in which OLEDs or PLEDs can be produced is known to the person skilled in the art and is described in detail, for example, as a general process in WO 2004/070772 A2, which should be adapted correspondingly for the individual case.

As described above, the hyperbranched polymers according to the invention are very particularly suitable as electroluminescent materials in PLEDs or displays produced in this way.

Electroluminescent materials in the sense of the present invention are taken to mean materials which can be used as active layer. Active layer means that the layer is capable of emitting light on application of an electric field (light-emitting layer) and/or that it improves the injection and/or transport of the positive and/or negative charges (charge-injection or charge-transport layer).

The present invention therefore preferably also relates to the use of the hyperbranched polymers or blends according to the invention in a PLED, in particular as electroluminescent material.

The present invention furthermore relates to electronic or opto-electronic devices, preferably organic or polymeric organic electroluminescent devices (OLED, PLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably organic or polymeric organic electroluminescent devices, in particular polymeric organic electroluminescent devices, having one or more active layers, where at least one of these active layers comprises one or more hyperbranched polymers according to the invention. The active layer can be, for example, a light-emitting layer, a charge-transport layer and/or a charge-injection layer.

The present application text and also the examples below are directed principally at the use of the hyperbranched polymers according to the invention in relation to PLEDs and corresponding displays. In spite of this restriction of the description, it is possible for the person skilled in the art, without further inventive step, also to use the hyperbranched polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the Claims, unless stated otherwise elsewhere.

EXAMPLES

Example 1

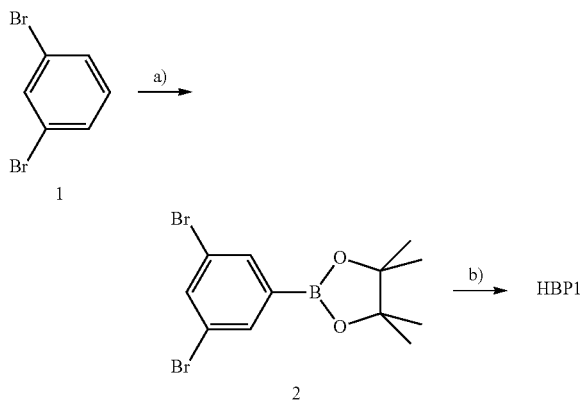

A) Preparation of the monomer (3,5-dibromophenyl)boronic ester (2)

19.5 g (82.7 mmol) of 1,3-dibromobenzene (1) and 24.0 g (94.5 mmol) of bis(pinacolato)diboron are suspended in 150 ml of cyclohexane. 1.50 g (5.59 mmol) of dtbpy and 500 mg (754 µmol) of [Ir(OMe)COD]$_2$ are added to this suspension, and the mixture is stirred at 80° C. for 16 hours. After cooling, the dark-brown mixture is added to 300 ml of ice-water and extracted three times with 300 ml of dichloromethane each time. The organic phase is separated off, washed with water and brine, dried over Na$_2$SO$_4$ and subsequently evaporated to dryness. The crude product is purified by column chromatography on silica gel (CH$_2$Cl$_2$), giving 2 as colourless solid in a yield of 85% (24.8 g, 68.5 mmol).

$^1$H NMR (500 MHz, CDCl$_3$) δ=7.84 (d, J=1.9 Hz, 2H), 7.74 (t, J=1.9 Hz, 1H), 1.34 (s, 12H).

$^{13}$C NMR (126 MHz, CDCl$_3$) δ=136.2, 135.6, 122.5, 84.2, 24.5.

APLI-HRMS m/e (C$_{12}$H$_{15}$BBr$_2$O$_2$): calculated mass: 359.9526 [M]$^+$, mass found: 359.9537 [M]$^+$.

The catalyst di-µ-methoxybis(1,5-cyclooctadiene)diiridium [Ir(OMe)COD]$_2$ and the ligand used 4,4'-di-tert-butyl-2,2'-bipyridine (dtbpy) are depicted in the following figure.

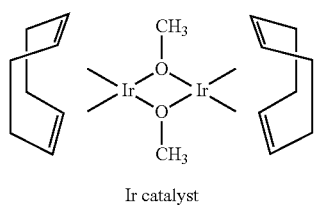

Ir catalyst

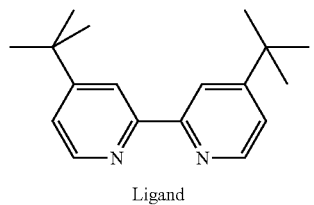

Ligand

B) Polymerisation of the monomer (3,5-dibromophenyl) boronic ester (2)

5.53 mmol of monomer (2) and 12.2 mmol of K$_3$PO$_4$ as base in a toluene/THF/water mixture (8 ml of toluene, 32 ml of THF and 20 ml of H$_2$O) are degassed for 30 minutes. 5.00 mg (22 µmol) of Pd(OAc)$_2$ and 42.0 mg (134 µmol) of P(o-tol)$_3$ are added, and the mixture is heated at a bath temperature of 100° C. After only a few minutes, a yellow solid deposits on the thermometer. Repeated dissolution in THF and precipitation in methanol gives HBP 1 having M$_n$=10300, M$_w$=16400 and a polydispersity of PD=1.6. ICP-MS measurements give a bromine content of 51%, which corresponds to one bromine end group per phenyl unit.

Example 2

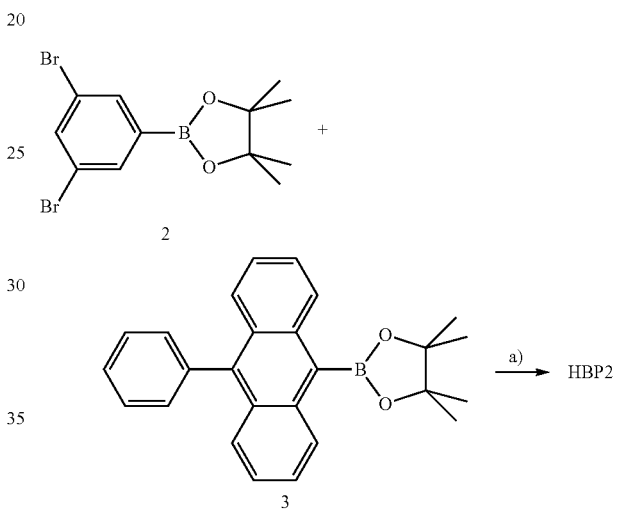

Analogously to Example 1, step 2, 2.76 mmol of monomer (2) in three separate batches are degassed for 30 minutes with in each case 3.02 mmol of an anthraceneboronic ester (3) as end capper and 12.2 mmol of K$_3$PO$_4$ in 8 ml of toluene, 32 ml of THF and 20 ml of H$_2$O. 5.00 mg (22 µmol) of Pd(OAc)$_2$ and 42.0 mg (134 µmol) of P(o-tol)$_3$ are added, and the mixture is heated at 100° C.

The weight averages, obtained by GPC, of polymers HBP 2 obtained are between 8000 and 11500 g/mol in the higher molecular range, a further peak is detected between 400 and 600 g/mol, which suggests an additional oligomeric system.

Example 3 a) Preparation of Biphenyl Monomer (7)

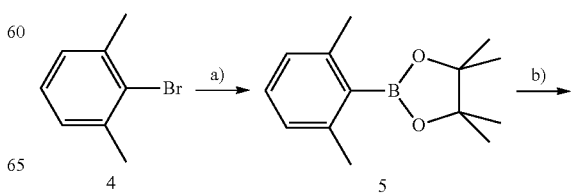

-continued

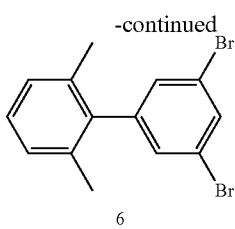
6 c)→

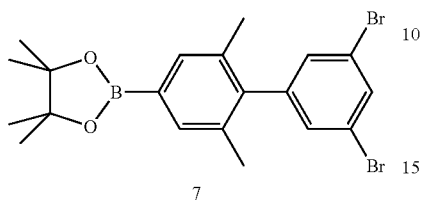
7

1st Step (5)

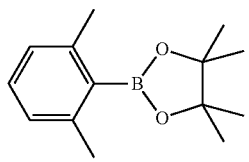 [SMILES: Cc1cccc(C)c1B1OC(C)(C)C(C)(C)O1]

27.8 g (150 mmol) of 2-bromo-m-xylene (4), 41.0 g (161 mmol) of bis(pinacolato)diboron and 43.0 g (438 mmol) of KOAc are suspended in 1 l of DMSO. 12.0 g (15.0 mmol) of Pd(dppf)$_2$Cl$_2$ are added to this suspension, and the mixture is stirred at 80° C. for 16 hours. After cooling, 1 l of dichloromethane and 2 l of water are added, the aqueous phase is extracted twice with 300 ml of dichloromethane each time, the combined organic phases are washed with water and brine, dried over Na$_2$SO$_4$ and subsequently evaporated to dryness. The crude product is purified by column chromatography on silica gel (CH$_2$Cl$_2$), giving 5 as colourless solid in a yield of 70% (24.4 g, 105 mmol).

$^1$H NMR (500 MHz, CDCl$_3$) δ=7.12 (t, J=7.6 Hz, 1H), 6.94 (d, J=7.6 Hz, 2H), 2.40 (s, 6H), 1.39 (s, 12H).

$^{13}$C NMR (126 MHz, CDCl$_3$) δ=141.4, 128.8, 126.1, 83.3, 24.6, 21.9.

APLI-HRMS m/e (C$_{14}$H$_{21}$BO$_2$): calculated mass: 232.1629 [M]$^+$, mass found: 232.1627 [M]$^+$.

2nd Step (6)

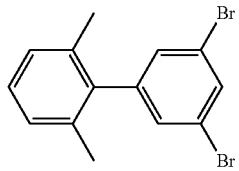 [SMILES: Cc1cccc(C)c1-c1cc(Br)cc(Br)c1]

19.4 g (53.6 mmol) of 1,3-dibromo-5-iodobenzene, 13.3 g (57.3 mmol) of 5 and 37.0 g (268 mmol) of K$_2$CO$_3$ are suspended in 400 ml of toluene and 350 ml of water. 980 mg (848 μmol) of Pd(PPh$_3$)$_2$Cl$_2$ are added to this sus-pension, and the mixture is heated under reflux for 16 hours. After cooling, the phases are separated, the combined organic phases are washed with water and brine, dried over Na$_2$SO$_4$ and subsequently evaporated to dryness. The crude product is purified by column chromatography on silica gel (n-heptane), giving 6 as colourless solid in a yield of 83% (15.2 g, 44.7 mmol).

$^1$H NMR (500 MHz, CDCl$_3$) δ=7.67 (t, J=1.8 Hz, 1H), 7.27 (d, J=1.8 Hz, 2H), 7.18 (dd, J=8.1 Hz, J=7.0 Hz, 1H), 7.10 (d, J=7.6 Hz, 2H), 2.05 (s, 6H).

$^{13}$C NMR (128 MHz, CDCl$_3$) δ=144.4, 138.6, 135.4, 132.1, 130.6, 127.5, 127.2, 122.7, 20.4.

EI-MS m/e (C$_{14}$H$_{12}$Br$_2$): calculated mass: 337.931 [M]$^+$, mass found: 337.930 [M]$^+$.

3rd Step (7)

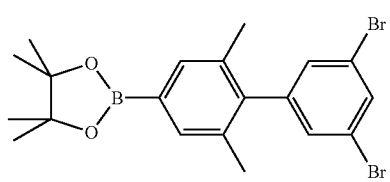 [SMILES: Cc1cc(B2OC(C)(C)C(C)(C)O2)cc(C)c1-c1cc(Br)cc(Br)c1]

29.2 g (85.9 mmol) of 6 and 32.9 g (130 mmol) of bis(pinacolato)diboron are suspended in 200 ml of cyclohexane. 2.0 g (7.45 mmol) of dtbpy and 500 mg (754 μmol) of [Ir(OMe)COD]$_2$ are added to this suspension, and the mixture is stirred at 80° C. for 16 hours. After cooling, the dark-brown mixture is added to 400 ml of ice-water and extracted three times with 300 ml of ethyl acetate each time. The organic phase is separated off, washed with water and brine, dried over Na$_2$SO$_4$ and subsequently evaporated to dryness. The crude product is extracted by stirring three times with hot acetonitrile and recrystallised twice from acetonitrile, giving 7 as colourless solid in a yield of 49% (19.7 g, 42.3 mmol).

$^1$H NMR (500 MHz, CDCl$_3$) δ=7.66 (t, J=1.7 Hz, 1H), 7.55 (s, 2H), 7.23 (d, J=1.7 Hz, 2H), 2.04 (s, 6H), 1.36 (s, 12H).

$^{13}$C NMR (126 MHz, CDCl$_3$) δ=144.3, 141.5, 134.7, 133.5, 132.1, 130.3, 122.7, 83.5, 24.5, 20.2.

ESI-HRMS m/e (C$_{20}$H$_{23}$BBr$_2$O$_2$): calculated mass: 465.0231 [M+H]$^+$, mass found: 465.0229 [M+H]$^+$.

B) Polymerisation of the Biphenyl Monomer (7)

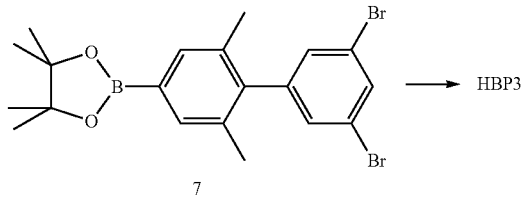
7 → HBP3

5.53 mmol of monomer (7) and 12.2 mmol of K$_3$PO$_4$ as base in a toluene/THF/water mixture (8 ml of toluene, 32 ml of THF and 20 ml of H$_2$O) are degassed for 30 minutes. In order to evaluate suitable polymerisation conditions, the biphenyl monomer (7) is polymerised under various conditions. The influence of various catalysts and bases in various solvents is investigated at a constant reaction time of 5 hours and a constant reaction temperature of 100° C. (Table 1).

TABLE 1

Influence of various reaction conditions on the molecular weight (M$_w$, M$_n$, PD).

| HBP 3 | Base | Cat + ligand | Solvent | M$_n$ | M$_w$ | PD |
|---|---|---|---|---|---|---|
| a | K$_3$PO$_4$ | Pd(OAc)$_2$ P(o-tol)$_3$ | Tol 2 THF 8 H$_2$O 5 | 30300 | 53200 | 1.8 |

TABLE 1-continued

Influence of various reaction conditions on the molecular weight ($M_w$, $M_n$, PD).

| HBP 3 | Base | Cat + ligand | Solvent | | $M_n$ | $M_w$ | PD |
|---|---|---|---|---|---|---|---|
| b | NaHCO$_3$ | Pd(OAc)$_2$ P(o-tol)$_3$ | Tol THF H$_2$O | 2 8 5 | 13300 | 22500 | 1.7 |
| c | NaHCO$_3$ | Pd(OAc)$_2$ P(o-tol)$_3$ | THF H$_2$O | 5 1 | 9800 | 17800 | 1.8 |
| d | Na$_2$CO$_3$ | Pd(OAc)$_2$ P(o-tol)$_3$ | THF H$_2$O | 5 1 | 13500 | 25800 | 1.9 |
| e | K$_3$PO$_4$ | Pd(OAc)$_2$ P(o-tol)$_3$ | THF H$_2$O | 5 1 | 13600 | 23300 | 1.7 |
| f | NaHCO$_3$ | Pd(PPh$_3$)$_4$ | THF H$_2$O | 5 1 | 8100 | 31400 | 3.9 |
| g | Na$_2$CO$_3$ | Pd(PPh$_3$)$_4$ | THF H$_2$O | 5 1 | 11500 | 38200 | 3.3 |
| h | K$_3$PO$_4$ | Pd(PPh$_3$)$_4$ | THF H$_2$O | 5 1 | 4100 | 7200 | 1.8 |
| i | KF | Pd(OAc)$_2$ S-Phos[84] | THF | | 2800 | 3400 | 1.2 |
| j | KF | Pd(OAc)$_2$ P(t-Bu)$_3$ | THF | | No polymer | | |

The aim is to achieve the highest possible molecular weight at the same time as low polydispersity. If the polymer remains in solution during the polymerisation, higher molecular weights are generally achieved, since precipitated polymer does not polymerise further.

As can be seen from the table, the highest molecular weights at the same time as similarly low polydispersity are achieved with Pd(OAc)$_2$/P(o-tol)$_3$ and base in toluene/THF/water (2:8:5) (HBP 3a,b).

For this reason, the further polymerisations with end groups are carried out with this catalyst system (combination of Pd(OAc)$_2$ and P(o-tol)$_3$) in toluene/THF/water (2:8:5).

Example 4

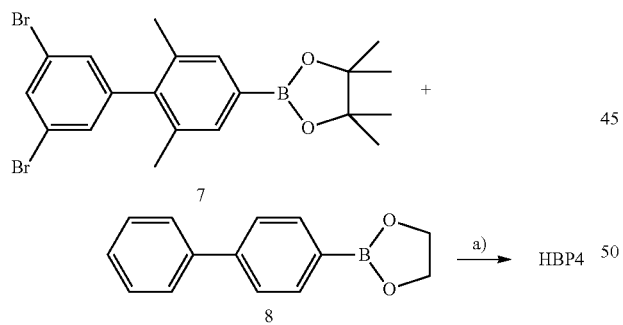

Analogously to Example 3, 2.76 mmol of monomer (7), 3.02 mmol of 2-biphenyl-4-yl-1,3,2-dioxaborolane (8) as end capper and 12.2 mmol of KaPO$_4$ as base in a toluene/THF/water mixture (8 ml of toluene, 32 ml of THF and 20 ml of H$_2$O) are degassed for 30 minutes. 5.00 mg (22 µmol) of Pd(OAc)$_2$ and 42.0 mg (134 µmol) of P(o-tol)$_3$ are added, and the mixture is heated at 100° C. A high-molecular-weight hyperbranched polymer HBP 4, which does not precipitate out, is already obtained after a reaction time of 3 hours.

The polymer HBP4 has a polydispersity of PD=1.8 and the following molecular weights: $M_n$=19600 and $M_w$=36200.

Example 5 a) Preparation of Monomer (9)

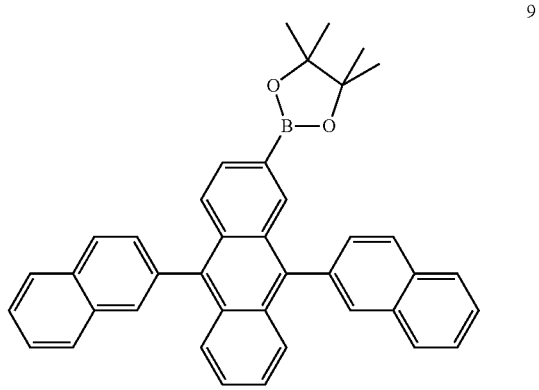 [SMILES: CC1(C)OB(c2ccc3c(-c4ccc5ccccc5c4)c4ccccc4c(-c4ccc5ccccc5c4)c3c2)OC1(C)C]

25.2 g (53.1 mmol) of (9,10-di-2-naphthyl)-2-anthraceneboronic acid are heated under reflux for 4 hours with 12.5 g (106 mmol) of anhydrous pinacol in 700 ml of toluene in a flask with water separator. After cooling, the solvent is removed under reduced pressure, and the crude product is recrystallised from n-heptane/THF, giving monomer (9) as yellow solid in a yield of 94% (27.9 g, 50.1 mmol).

$^1$H NMR (500 MHz, CDCl$_3$) δ=8.31 (s, 1H), 8.13-7.92 (m, 8H), 7.74-7.70 (m, 2H), 7.70-7.57 (m, 8H), 7.34-7.27 (m, 2H), 1.26 (d, J=2.4 Hz, 12H).

$^{13}$C NMR (126 MHz, CDCl$_3$)=138.3, 136.9, 136.7, 136.5, 135.6, 133.5, 133.5, 132.9, 132.8, 131.1, 130.8, 130.5, 130.3, 129.9, 129.7, 129.4, 129.3, 128.4, 128.2, 128.0, 128.0, 128.0, 127.4, 127.0, 126.4, 126.3, 126.2, 126.1, 126.0, 125.5, 125.0, 83.8, 24.8.

ESI-HRMS m/e (C$_{40}$H$_{33}$BO$_2$): calculated mass: 556.2573 [M]$^+$, mass found: 557.2633 [M+H]$^+$.

B) Preparation of the Polymer

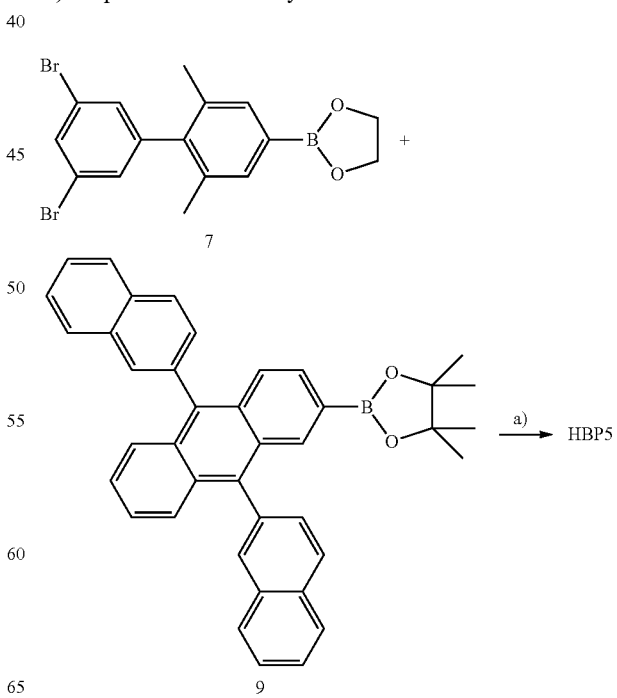

Analogously to Example 3, 2.76 mmol of monomer (7), 3.02 mmol of anthracenylboronic ester (9) as end capper and 12.2 mmol of $K_3PO_4$ as base in a toluene/THF/water mixture (8 ml of toluene, 32 ml of THF and 20 ml of $H_2O$) are degassed for 30 minutes. 5.00 mg (22 µmol) of $Pd(OAc)_2$ and 42.0 mg (134 µmol) of $P(o-tol)_3$ are added, and the mixture is heated at 100° C. After a reaction time of 6 hours, HBP 5 is isolated.

The polymer HBP5 has a polydispersity of PD=1.6 and the following molecular weights: $M_n$=7800 and $M_w$=12800.

Example 6

A) Preparation of Monomer (11)

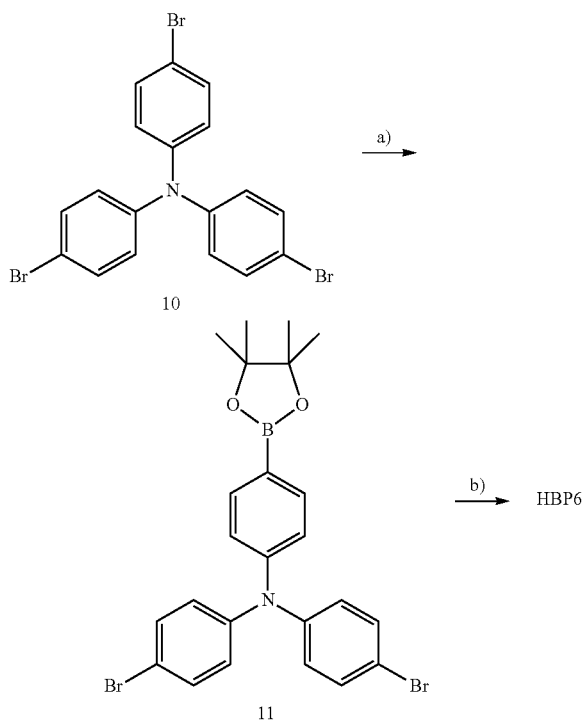

79.0 ml (126 mmol) of n-butyllithium (2.5 M in n-hexane) are added dropwise with vigorous stirring at −78° C. to a suspension of 60.0 g (124 mmol) of tris(4-bromophenyl) amine in 1200 ml of diethyl ether, and the mixture is stirred for a further 1 hour. 43.0 mil (379 mmol) of timethyl borate are added to the solution with vigorous stirring, the mixture is stirred at −78° C. for a further 1 hour, then warmed to room temperature. The reaction mixture is added to 1.5 l of ice-water and extracted with ethyl acetate. The combined organic phases are washed once with water, once with $NH_4Cl$ solution and once with brine, dried over $Na_2SO_4$ and finally evaporated to dryness. The boronic acid obtained is refluxed on a water separator for 5 hours with 21.0 g (178 mmol) of pinacol in 800 ml of toluene. The crude product is purified by column chromatography on silica gel (n-heptane/ethyl acetate, 10:1) and recrystallised three times from n-heptane, giving 11 as colourless solid in a yield of 39% (25.7 g, 48.6 mmol).

$^1$H NMR (500 MHz, $CDCl_3$) δ=7.72-7.64 (m, 2H), 7.39-7.31 (m, 4H), 7.03-6.97 (m, 2H), 6.97-6.91 (m, 4H), 1.33 (s, 12H).

$^{13}$C NMR (126 MHz, CDCs) δ=149.62, 146.17, 136.13, 132.48, 126.15, 122.50, 116.18, 83.75, 24.89.

APCI-HRMS me ($C_{24}H_{24}BBr_2NO_2$): calculated mass: 528.0340 [M+H]$^+$, mass found: 528.0327 [M+H]$^+$.

B) polymerisation of Monomer (11)

5.53 mmol of monomer (11) and 12.2 mmol of $K_3PO_4$ as base in a toluene/THF/water mixture (8 ml of toluene, 32 ml of THF and 20 ml of $H_2O$) are degassed for 30 minutes. 5.00 mg (22 µmol) of $Pd(OAc)_2$ and 42.0 mg (134 µmol) of $P(o-tol)_3$ are added, and the mixture is heated at a bath temperature of 100° C. for 1.5 hours.

The reaction of (11) gives HBP 6 as amine-containing polymer. HBP 6 can be regarded as polymeric benzidine, which can be employed as hole-transport material in the OLED.

With a polydispersity of PD=1.6 and a molecular weight of M=16000, a hyperbranched system having 50 recurring units has formed.

Example 7

Polymerisation of Monomer (11) with Various End Groups

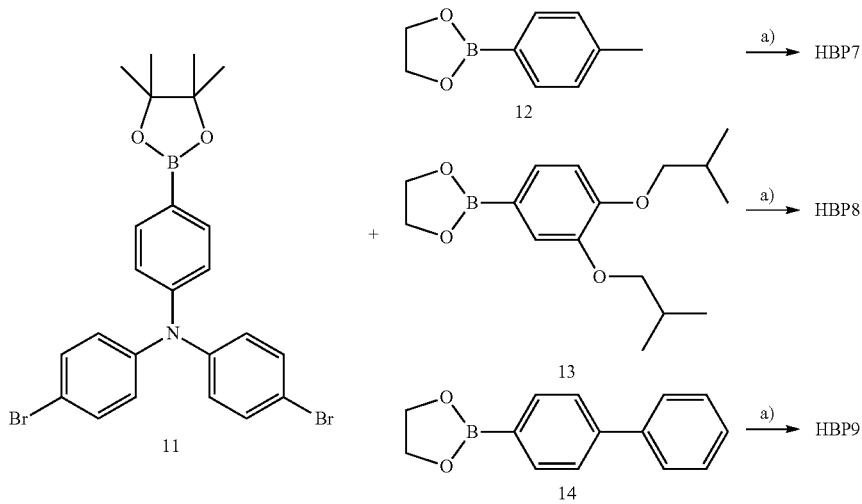

In each case, 2.76 mmol of monomer (11), 3.02 mmol of an end capper and 12.2 mmol of $K_3PO_4$ as base in a toluene/THF/water mixture (8 ml of toluene, 32 ml of THF and 20 ml of $H_2O$) are degassed for 30 minutes. The end cappers used are: 2-µ-tolyl-1,3,2-dioxaborolane (12), 2-(3,4-diisobutoxyphenyl)-1,3,2-dioxaborolane (13) and 2-µ-biphenyl-1,3,2-dioxaborolane (14). 5.00 mg (22 µmol) of $Pd(OAc)_2$ and 42.0 mg (134 µmol) of $P(o-tol)_3$ are added, and the mixture is heated at 100° C. for 1.5 hours.

The molecular weights $M_n$ and $M_w$ and the polydispersity PD of polymers HBP7, HBP8 and HBP9a are listed in Table 2.

In addition, the reaction of monomer (11) with end group (14) is repeated again with 1.5-fold dilution (HBP9b).

The polymers all exhibit broader molecular-weight distributions than homopolymer HBP 6.

TABLE 2

Molecular weights, polydispersities and bromine content of HBP 7, HBP 8, HBP 9a, HBP 9b

| | End group | $M_n$ | $M_w$ | PD |
|---|---|---|---|---|
| HBP 7 | 12 | 5100 | 19200 | 3.8 |
| HBP 8 | 13 | 14600 | 37700 | 2.6 |
| HBP 9a | 14 | 12700 | 36200 | 2.9 |
| HBP 9b | 14 | 3800 | 10900 | 2.9 |

Example 8

Polymerisation of Monomer (11) with End Group (15)

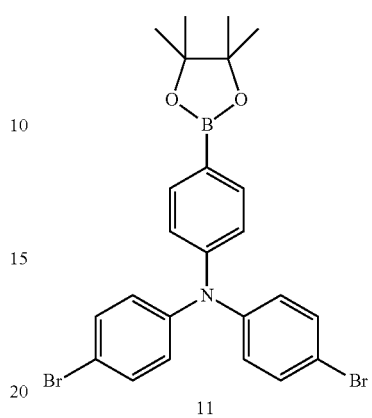

2.12 g (4.00 mmol) of monomer (11) and 4.05 mmol of end capper (15) are degassed for 30 minutes with a toluene/dioxane/water mixture (40 ml each) with 17.6 mmol of $K_3PO_4$ as base. 55.8 mg (80.0 µmol) of the catalyst system chloro{[RuPhos][2-(2-aminoethylphenyl)]-Pd(II)}/[RuPhos] admixture (PdP/P=1:1) are then added, and the mixture is heated at 100° C. for 1.5 hours. End capper (15) is employed here as solubility-promoting group.

The catalyst system is depicted in the following figure.

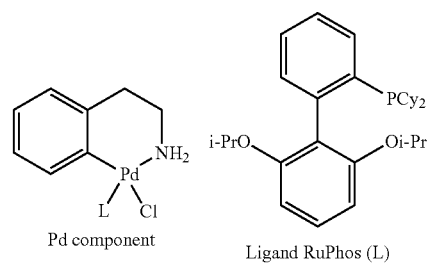

Pd component     Ligand RuPhos (L)

The molecular weights $M_n$ and $M_w$ and the polydispersity PD of polymer HBP10 are listed in Table 3.

Example 9

Polymerisation of Monomer (11) with End Groups (16) and (17)

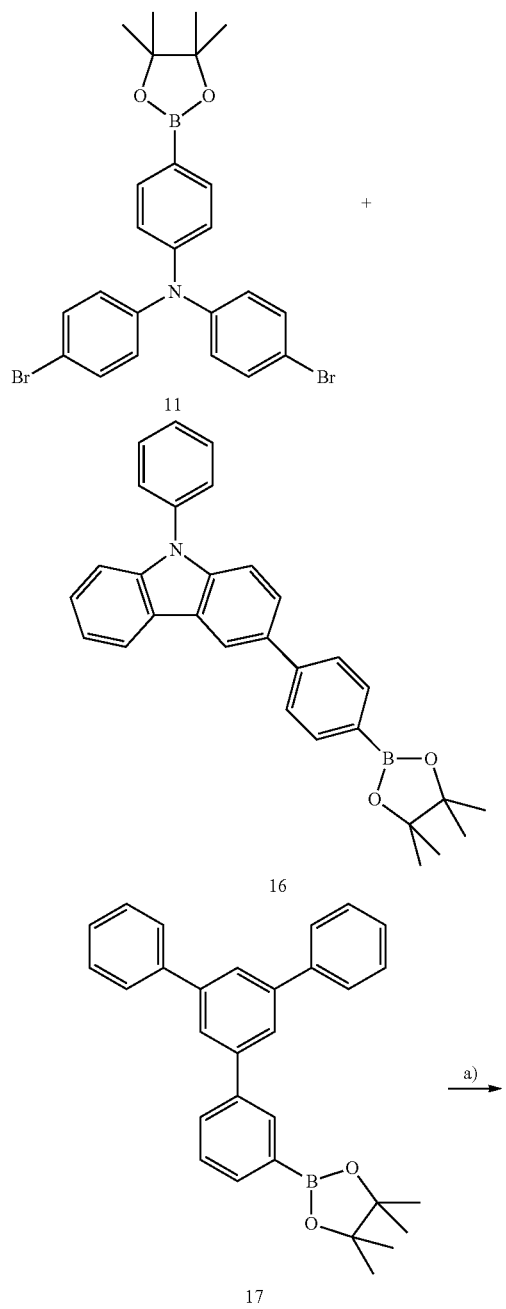

2.12 g (4.00 mmol) of monomer (11) and 4.20 mmol of two different end cappers (16) and (17) are degassed for 30 minutes with a toluene/dioxane/water mixture (40 ml each) with 17.6 mmol of $K_3PO_4$ as base. 55.8 mg (80 µmol) of RuPhos are then added, and the mixture is heated at 100° C. for 1.5 hours.

End group (16) carries an additional carbazole function [prepared by borylation of 3-(4-bromophenyl)-9-phenyl-9H-carbazole], which is frequently employed combined with triarylamines in hole-conducting layers. As second end group, (17) is selected as solubility promoter.

The polymerisations to give HBP 11a and HBP 11b are carried out under the same conditions as described for HBP 10, the amounts of (16) and (17) vary slightly here. For HBP 11a, 0.85 equivalents of (16) and 0.20 equivalents of (17) are employed, for HBP 11b these are 0.80 equivalents of (16) and 0.25 equivalents of (17).

The molecular weights $M_n$ and $M_w$ and the polydispersity PD of polymers HBP11a and HBP11b are listed in Table 3.

Example 10

Polymerisation of Monomer (11) with End Groups (16), (17) and (18)

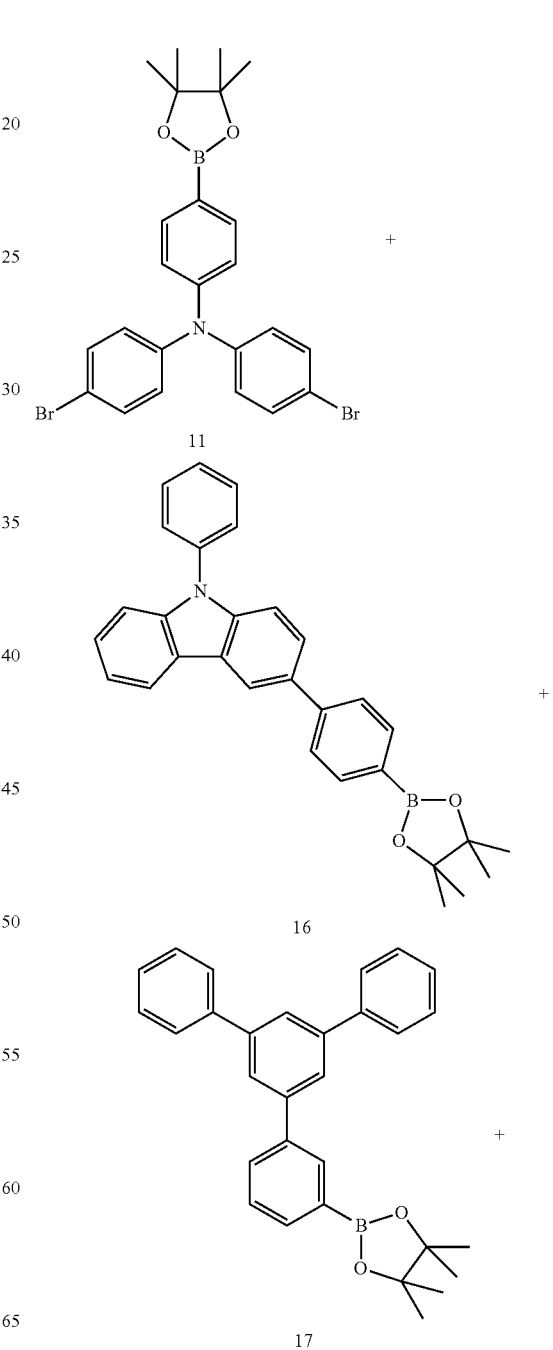

-continued

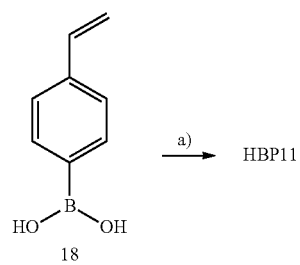

2.12 g (4.00 mmol) of monomer (11) and 4.20 mmol of three different end cappers (16), (17) and (18) are degassed for 30 minutes with a toluene/dioxane/water mixture (40 ml each) with 17.6 mmol of KaPO$_4$ as base. 55.8 mg (80 μmol) of RuPhos are then added, and the mixture is heated at 100° C. for 1.5 hours.

Monomer (11) is thus additionally functionalised in one step with a further end group (18) apart from with the two different end groups (16) and (17) (see Example 9). The additional end group, 4-styrylboronic acid (18), functions as crosslinkable group in the hyperbranched polymer and is intended to make the hole-conducting polymer in the film of the OLED insoluble.

The polymerisation to give HBP12 is carried out under the same conditions as described for HBP 10. For HBP12, 0.70 equivalents of (16) and 0.25 equivalents of (17) and 0.10 equivalents of (18) are employed The molecular weights M$_n$ and M$_w$ and the polydispersity PD of polymer HBP12 are listed in Table 3.

TABLE 3

Molecular weights, polydispersities and bromine content of HBP 10, HBP 11a, HBP 11b, HBP 12

| | M$_n$ | M$_w$ | PD |
|---|---|---|---|
| HBP 10 | 23900 | 57500 | 2.4 |
| HBP 11a | 18800 | 84600 | 4.5 |
| HBP 11b | 22500 | 56400 | 2.5 |
| HBP 12 | 16000 | 26300 | 1.6 |

Examples 11 and 12

Production of OLED Devices

Device Data of the Hole-Transport Materials

Hyperbranched polymers HBP 7 and HBP 8 prepared in Example 7 are employed as hole-transport materials in a blue-emitting OLED.

To this end, 20 nm of PEDOT:PSS from aqueous solution and then 20 nm of the hyperbranched polymer prepared as hole-transport material (HTM) from toluene solution are applied to an ITO anode. The emitting layer (EML) (20 nm) is applied to this hole-transport layer. To this end, matrx material M1 (99%) and dark-blue emitter E1 (1%) are applied by vapour deposition.

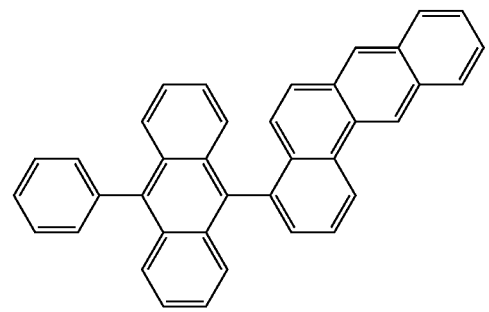

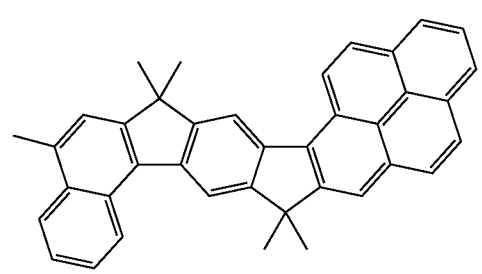

The electron-transport layer (ETL) (30 nm), which comprises 50% of each of the two following materials, is applied to this emitter layer by vapour deposition.

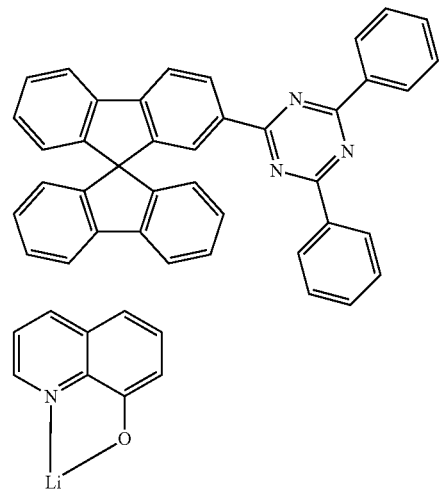

Finally, an aluminium layer with a thickness of 100 nm is applied as cathode.

The device structure is depicted in FIG. 1. Table 4 compares the electro-optical data of the two OLED components with one another.

Electro-Optical Characterisation:

For the electro-optical characterisation, the OLEDs produced in Examples 11 and 12 are clamped into holders manufactured especially for the substrate size and provided with spring contacts. A photodiode with eye response filter can be attached directly to the measurement holder in order to exclude extraneous-light influences.

The voltages are typically increased from 0 to max. 20 V in 0.2 V steps and reduced again. For each measurement point, the current through the PLED and the photocurrent obtained is measured by the photodiode. In this way, the IVL data of the test PLED are obtained. Important characteristic quantities are the measured maximum efficiency ("eff." in cd/A), the external quantum efficiency (EQE in %) and the voltage (U in volts).

In order, in addition, to know the colour and the precise electroluminescence spectrum of the test PLED, the voltage required is applied again after the first measurement, and the photodiode is replaced by a spectrum measurement head. This is connected to a spectrometer (Ocean Optics) by an optical fibre. The colour coordinates (CIE: Commission International de l'éclairage, 1931 standard observer) can be derived from the measured spectrum.

TABLE 4

Electro-optical data of the OLEDs processed from solution in device structure B with HBP 7 and HBP 8; $^{a)}$ @ 1000 cd/m$^2$, $^{b)}$ @ 10 mA/cm$^2$.

| HBP | EL [nm] | CIE x/y | Efficiency$^{a)}$ [cd/A] | EQE$^{a)}$ [%] | Voltage$^{b)}$ [V] |
|---|---|---|---|---|---|
| HBP 7 | 446, 476 | 0.15/0.12 | 4.3 | 3.9 | 3.8 |
| HBP 8 | 446, 476 | 0.15/0.13 | 3.7 | 3.5 | 3.6 |

The CIE colour coordinates differ only slightly from one another, the two curves in the EL spectrum lie almost above one another. The EL maxima are $\lambda_{max}$=446 nm and $\lambda$=476 nm with a shoulder in the bathochromic region.

The efficiency of the OLED with HBP 7 is, at 4.3 cd/A, somewhat higher than that in the component with HBP 8 (3.7 cd/A), but both efficiencies are in the range to be expected. The current density/voltage characteristic lines have a very similar shape.

The invention claimed is:

1. A hyperbranched polymer comprising at least one unit of formula (I)

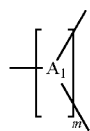
(I)

wherein $A_1$ is a functional structural element;

m is an integer≥3; and the lines are connections to further units of the polymer; and at least one unit of formula (II)

(II)

wherein $A_2$ is a functional structural element;

l is an integer≥1; and the line is a connection to another unit of the polymer, wherein at least one unit of formula (II) is selected from a solubility-promoting unit of formula (IIId2):

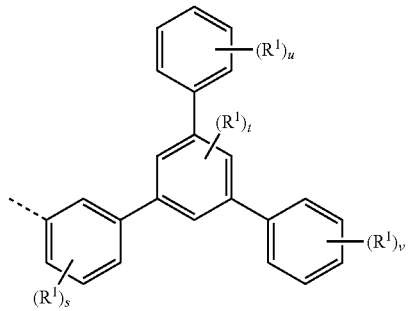
(IIId2)

wherein $R^1$ is, in each case, independently of one another, hydrogen, a straight-chain alkyl, alkenyl, alkoxy, or thioalkoxy group having 1 or 2 to 40 C atoms respectively or a branched or cyclic alkyl, alkenyl, alkoxy, or thioalkoxy group having 3 to 40 C atoms, or is a silyl group or a substituted keto group having 1 to 40 C atoms, an alkoxycarbonyl group having 2 to 40 C atoms, an aryloxycarbonyl group having 7 to 40 C atoms, a formyl group (—C(=O)—H), an isocyano group, a $CF_3$ group, Cl, Br, F, and a crosslinkable group; and s is 0, 1, 2, 3, or 4;

t is 0, 1, 2, or 3; and u and v
are each, independently of one another, 0, 1, 2, 3, 4, or 5;

wherein the dashed bond indicates the bond to a further unit of the hyperbranched polymer.

2. The hyperbranched polymer of claim 1, wherein the functional structural element $A_1$ is a structural element which has hole-injection and/or hole-transport properties and is selected from the group consisting of triarylamine derivatives, benzidine derivatives, tetraaryl-para-phenylenediamine derivatives, triaryl-phosphine derivatives, phenothiazine derivatives, phenoxazine derivatives, dihydrophenazine derivatives, thianthrene derivatives, dibenzo-para-dioxin derivatives, phenoxathyine derivatives, carbazole derivatives, azulene derivatives, pyrrole derivatives, furan derivatives, and O—, S—, or N-containing heterocycles having a high HOMO.

3. The hyperbranched polymer of claim 1, wherein the functional structural element $A_1$ is a structural element which has electron-injection and/or electron-transport properties and is selected from the group consisting of pyridine derivatives, pyrimidine derivatives, pyridazine derivatives, pyrazine derivatives, oxadiazole derivatives, quinolone derivatives, quinoxaline derivatives, anthracene derivatives, benzanthracene derivatives, pyrene derivatives, perylene derivatives, benz-imidazole derivatives, triazine derivatives, triphenylene derivatives, ketone derivatives, phosphine oxide derivatives, phenazine derivatives, triarylboranes, and O—, S—, or N-containing heterocycles having a low LUMO.

4. The hyperbranched polymer of claim 1, wherein the functional structural element $A_1$ is a structural element which emits light and is selected from the group consisting of fluorescent emitters and phosphorescent emitters.

5. The hyperbranched polymer of claim 1, wherein the functional structural element $A_1$ is a structural element which is a host material and is an oligoarylene.

6. The hyperbranched polymer of claim 1, wherein the functional structural element $A_1$ or $A_2$ is a solubility-promoting unit of formula (IIId2):

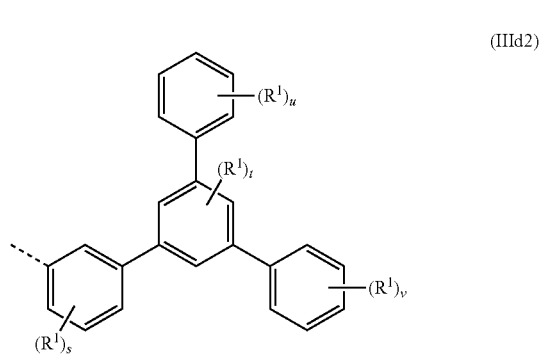

(IIId2)

wherein
$R^1$ is, in each case, independently of one another, hydrogen, a straight-chain alkyl, alkenyl, alkoxy, or thioalkoxy group having 1 or 2 to 40 C atoms respectively or a branched or cyclic alkyl, alkenyl, alkoxy, or thioalkoxy group having 3 to 40 C atoms, or is a silyl group or a substituted keto group having 1 to 40 C atoms, an alkoxycarbonyl group having 2 to 40 C atoms, an aryloxycarbonyl group having 7 to 40 C atoms, a formyl group (—C(=O)—H), an isocyano group, a $CF_3$ group, Cl, Br, F, and a crosslinkable group; and s is 0, 1, 2, 3, or 4;
t is 0, 1, 2, or 3; and
u and v
are each, independently of one another, 0, 1, 2, 3, 4, or 5;
wherein the dashed bond indicates the bond to a further unit of the hyperbranched polymer.

7. The hyperbranched polymer of claim 1, wherein the units of formula (I) are selected from the group consisting of:
units which have hole-injection and/or hole-transport properties and are selected from the group consisting of triarylamine derivatives, benzidine derivatives, tetraaryl-para-phenylenediamine derivatives, triarylphosphine derivatives, phenothiazine derivatives, phenoxazine derivatives, dihydrophenazine derivatives, thianthrene derivatives, dibenzo-para-dioxin derivatives, phenoxathyine derivatives, carbazole derivatives, azulene derivatives, pyrrole derivatives, furan derivatives, and O—, S—, or N-containing heterocycles having a high HOMO;
units which have electron-injection and/or electron-transport properties and are selected from the group consisting of pyridine derivatives, pyrimidine derivatives, pyridazine derivatives, pyrazine derivatives, oxadiazole derivatives, quinolone derivatives, quinoxaline derivatives, anthracene derivatives, benzanthracene derivatives, pyrene derivatives, perylene derivatives, benzimidazole derivatives, triazine derivatives, triphenylene derivatives, ketone derivatives, phosphine oxide derivatives, phenazine derivatives, triarylboranes, and O—, S—, or N-containing heterocycles having a low LUMO; and
units which have light-emitting properties and are selected from the groups consisting of fluorescent emitters and phosphorescent emitters; and
the units of formula (II) are selected from solubility-promoting structural units of formula -(IIId2):

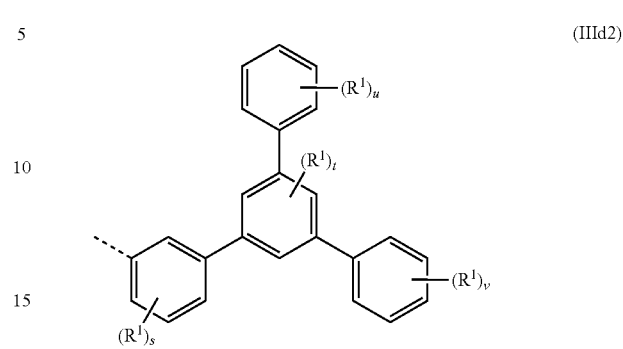

(IIId2)

wherein
$R^1$ is in each case, independently of one another, hydrogen, a straight-chain alkyl, alkenyl, alkoxy, or thioalkoxy group having 1 or 2 to 40 C atoms respectively or a branched or cyclic alkyl, alkenyl, alkoxy, or thioalkoxy group having 3 to 40 C atoms, or is a silyl group or a substituted keto group having 1 to 40 C atoms, an alkoxycarbonyl group having 2 to 40 C atoms, an aryloxycarbonyl group having 7 to 40 C atoms, a formyl group (—C(=O)—H), an isocyano group, a $CF_3$ group, Cl, Br, F, and a crosslinkable group; and s is 0, 1, 2, 3, or 4;
t is 0, 1, 2, or 3; and
u and v
are each, independently of one another, 0, 1, 2, 3, 4, or 5;
wherein the dashed bond indicates the bond to a further unit of the hyperbranched polymer.

8. A polymer mixture comprising one or more hyperbranched polymers of claim 1 and one or more further polymeric, oligomeric, dendritic, or low-molecular-weight substances.

9. A formulation comprising one or more hyperbranched polymers of claims 1 in one or more solvents.

10. A formulation comprising a polymer mixture of claim 8 in one or more solvents.

11. An electronic or opto-electronic device comprising one or more active layers, wherein at least one of said one or more active layers comprises one or more hyperbranched polymers of claim 1.

12. The electronic or opto-electronic device of claim 11, wherein said electronic or opto-electronic device is selected from the group consisting of organic electroluminescent devices, polymeric organic electroluminescent devices, organic field-effect transistors, organic integrated circuits, organic thin-film transistors, organic solar cells, organic laser diodes, organic photovoltaic elements and devices, and organic photoreceptors.

13. The electronic or opto-electronic device of claim 11, wherein said electronic or opto-electronic device is an organic or polymeric organic electroluminescent device.

14. An electronic or opto-electronic device comprising the polymer mixture of claim 8.

15. An electronic or opto-electronic device comprising the formulation of claim 9.

16. An electronic or opto-electronic device comprising the formulation of claim 10.

17. The hyperbranched polymer of claim 1, wherein $A_2$ is a functional structural element different from $A_1$.

* * * * *